United States Patent
Namkung et al.

(10) Patent No.: US 10,908,340 B2
(45) Date of Patent: Feb. 2, 2021

(54) DISPLAY DEVICE

(71) Applicant: Samsung Display Co., Ltd., Yongin (KR)

(72) Inventors: Jun Namkung, Asan-si (KR); Kwanghyeok Kim, Anyang-si (KR); Soonryong Park, Sejong (KR); Jungho So, Cheonan-si (KR); Chulwoo Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 130 days.

(21) Appl. No.: 14/733,769

(22) Filed: Jun. 8, 2015

(65) Prior Publication Data

US 2016/0062018 A1 Mar. 3, 2016

(30) Foreign Application Priority Data

Sep. 2, 2014 (KR) .................. 10-2014-0116212

(51) Int. Cl.
| | |
|---|---|
| *G02B 5/30* | (2006.01) |
| *H01L 27/32* | (2006.01) |
| *H01L 51/52* | (2006.01) |
| *H01L 51/00* | (2006.01) |

(Continued)

(52) U.S. Cl.
CPC ......... *G02B 5/3083* (2013.01); *G02F 1/1345* (2013.01); *G02F 1/13363* (2013.01);
(Continued)

(58) Field of Classification Search
CPC ......... H01L 51/5237; H01L 2251/5338; H01L 27/3276; H01L 51/0097; H01L 51/5253;
(Continued)

(56) References Cited

U.S. PATENT DOCUMENTS

| | | |
|---|---|---|
| 8,547,505 B2 | 10/2013 | Oh et al. |
| 9,448,431 B2 | 9/2016 | Park |

(Continued)

FOREIGN PATENT DOCUMENTS

| | | |
|---|---|---|
| CN | 104700771 A | 6/2015 |
| EP | 2881782 A2 | 6/2015 |

(Continued)

*Primary Examiner* — Vongsavanh Sengdara
(74) *Attorney, Agent, or Firm* — Lewis Roca Rothgerber Christie LLP

(57) ABSTRACT

A display device comprises a display panel and an optical plate. The display panel comprises a surface comprising a display area and a non-display area, the display panel further comprising a bending portion that is bent and a non-bending portion that is not bent. The display panel comprises: a base substrate, an array of pixels formed over the base substrate, and electrically conductive lines disposed over the base substrate and electrically connecting the array of pixels to an exterior device, the electrically conductive lines comprising at least one extension formed in the bending portion and overlapping the non-display area when viewed in a thickness direction of the display panel. The optical plate is disposed over the display panel, and comprises: a first optical plate portion covering the display area, and a second optical plate portion covering the at least one extension of the electrically conductive lines.

23 Claims, 21 Drawing Sheets

(51) Int. Cl.
*G02F 1/1335* (2006.01)
*G02F 1/13363* (2006.01)
*G02F 1/1345* (2006.01)
*G02F 1/1333* (2006.01)

(52) U.S. Cl.
CPC .... *G02F 1/133502* (2013.01); *H01L 27/3276* (2013.01); *H01L 51/0097* (2013.01); *H01L 51/5237* (2013.01); *H01L 51/5253* (2013.01); *H01L 51/5281* (2013.01); *H01L 51/5293* (2013.01); *G02F 2001/133388* (2013.01); *G02F 2001/133638* (2013.01); *G02F 2201/56* (2013.01); *H01L 2251/5338* (2013.01); *Y02E 10/549* (2013.01)

(58) Field of Classification Search
CPC ............ H01L 51/5281; H01L 51/5293; G02B 5/3083; G02F 1/1345; G02F 1/13363; G02F 1/133502; G02F 2001/133388; G02F 2001/133638; G02F 2201/56; Y02E 10/549
See application file for complete search history.

(56) References Cited

U.S. PATENT DOCUMENTS

| | | | |
|---|---|---|---|
| 10,111,301 B2 | 10/2018 | Ka et al. | |
| 2010/0033443 A1* | 2/2010 | Hashimoto | G02F 1/13338 345/173 |
| 2013/0002133 A1* | 1/2013 | Jin | H01L 51/524 313/511 |
| 2014/0098471 A1 | 4/2014 | Nam | |
| 2014/0159001 A1* | 6/2014 | Park | H01L 51/52 257/40 |
| 2014/0226206 A1* | 8/2014 | Park | G02F 1/133308 359/483.01 |
| 2015/0077953 A1 | 3/2015 | Namkung et al. | |
| 2015/0154898 A1 | 6/2015 | Jung | |
| 2016/0035812 A1* | 2/2016 | Kwon | H01L 29/66757 257/40 |

FOREIGN PATENT DOCUMENTS

| | | |
|---|---|---|
| KR | 10-0899534 B1 | 3/2009 |
| KR | 10-2010-0009910 A | 1/2010 |
| KR | 10-2011-0090111 A | 8/2011 |
| KR | 10-2013-0003893 A | 1/2013 |
| KR | 10-2013-0116748 A | 10/2013 |
| KR | 10-1328848 B1 | 11/2013 |
| KR | 10-2014-0001576 A | 1/2014 |
| KR | 10-2014-0085031 A | 7/2014 |
| KR | 10-1425717 B1 | 7/2014 |
| KR | 10-2014-0101601 A | 8/2014 |
| KR | 10-2015-0031096 A | 3/2015 |
| KR | 10-2015-0065053 A | 6/2015 |

* cited by examiner

DISPLAY DEVICE

CROSS-REFERENCE TO RELATED APPLICATION

This U.S. non-provisional patent application claims priority under 35 U.S.C. § 119 of Korean Patent Application No. 10-2014-0116212, filed on Sep. 2, 2014, the contents of which are hereby incorporated by reference in its entirety.

BACKGROUND

1. Field of Disclosure

The present disclosure relates to a display device. More particularly, the present disclosure relates to a display device having improved reliability.

2. Description of the Related Art

In recent years, various display devices, such as a liquid crystal display device, an electrowetting display device, an electrophoretic display device, etc., are used. The display device includes a display panel configured to include lines, e.g., gate lines and data lines, and pixels. The pixels are alternately connected to the data lines adjacent thereto for an inversion driving scheme.

The display device, which has been developed in recent years, includes a bending portion in which a portion of the display device is bent. However, when the display device includes the bending area, the electrically conductive lines disposed in the bending portion are influenced by vertical stress. As a result, a crack occurs in the lines disposed in the bending area.

SUMMARY

The present disclosure provides a display device capable of reducing crack occurring therein and improving reliability thereof.

One aspect of the invention provides a display device comprising: a display panel comprising a surface comprising a display area in which an image is displayed and a non-display area in which the image is not displayed, the display panel further comprising a bending portion that is bent and a non-bending portion that is not bent, the display panel comprising: a base substrate, an array of pixels formed over the base substrate, and electrically conductive lines disposed over the base substrate and electrically connecting the array of pixels to an exterior device, the electrically conductive lines comprising at least one extension formed in the bending portion and overlapping the non-display area when viewed in a thickness direction of the display panel; and an optical plate disposed over the display panel, the optical plate comprising: a first optical plate portion covering the display area; and a second optical plate portion covering the at least one extension of the electrically conductive lines.

In the foregoing device, the optical plate may comprise a retardation film overlapping the array of pixels, and the retardation film does not extend to the second optical plate portion. The first optical plate portion may have a thickness greater than that of the second optical plate portion. The bending portion may be bent with reference to a bend line and the second optical plate portion extends from the first optical plate portion along the bend line and connected to the first optical plate portion at the bend line, wherein the first and second optical plate portions are at least partly bent with reference to the bend line together with the bending portion.

Still in the foregoing device, the display device may further comprise: a printed circuit board electrically connected to the display panel; and a tape carrier package connecting the display panel and the printed circuit board, wherein the electrically conductive lines comprise: first lines disposed in the bending portion and overlapping the display area; second lines overlapping the non-display area and connecting between the first lines and the tape carrier package; third lines disposed in the non-bending portion and overlapping the display area; and fourth lines overlapping the non-display area and connecting between the third lines and the tape carrier package, the first optical plate portion covers the first lines and the third lines, and the second optical plate portion covers the at least one extension of the second lines. The bending portion may be bent with reference to a bend line extending along a first direction, wherein the display area has a substantially rectangular shape, and the non-display area surrounds the display area when viewed in the thickness direction. Each of the second lines may comprises: a bending line portion disposed in the bending portion and comprising the at least one extension; and a non-bending line portion disposed in the non-bending portion, and wherein the second optical plate portion covers the bending line portion, wherein the second optical plate portion further covers at least a portion of the non-bending line portion.

Yet in the foregoing device, the optical plate may further comprise: a retardation film overlapping the array of pixels; a lower protective film disposed over the retardation film; a polarizer disposed over the lower protective film; and an upper protective film disposed over the polarizer, wherein the polarizer comprises a first portion disposed in the first optical plate portion and a second portion disposed in the second optical plate portion. The retardation film does not include a portion disposed between the second portion of the polarizer and the display panel. Each of the upper protective film and the lower protective film may comprise a first portion disposed in the first optical plate portion and a second portion disposed in the second optical plate portion. The lower protective film does not include a portion disposed between the second portion of the polarizer and the display panel, and the upper protective film may comprise a first portion disposed in the first optical plate portion and a second portion disposed in the second optical plate portion.

Further in the foregoing device, the display device may further comprise a polarization pressure-sensitive adhesive layer disposed between the display panel and the optical plate, wherein the polarization pressure-sensitive adhesive layer comprises: a first polarization pressure-sensitive adhesive layer portion overlapping the first optical plate portion; and a second polarization pressure-sensitive adhesive layer portion overlapping the second optical plate portion, and the second polarization pressure-sensitive adhesive layer portion has a thickness equal to or greater than that of the first polarization pressure-sensitive adhesive layer portion. The first optical plate portion may have a substantially rectangular shape and the second optical plate portion is connected to an end portion of a side of the first optical plate portion. The second optical plate portion may have a polygonal shape, a circular shape, a semi-circular shape, or an oval shape. The display panel may comprise a second bending portion, wherein the non-bending portion is disposed between the bending portion and the second bending portion when viewed in the thickness direction, wherein the electrically conductive lines comprise a second extension formed in the second bending portion and overlapping the non-display area when viewed in the thickness direction of the display panel, wherein the optical plate further comprises a third optical plate portion covering the second extension of the electrically conductive lines. The at least one extension may be disposed between the base substrate and the second optical plate portion such that the at least one extension is disposed closer to a neutral plane of the bending portion than that of the bending portion when there would not have been the second optical plate portion covering the at least one extension.

Another aspect of the invention provides a display device comprising: a display panel comprising a display area in which an image is displayed and a non-display area in which the image is not displayed; and an optical plate disposed over the display panel and comprising a retardation film overlapping the display area and not overlapping the non-display area, wherein the non-display area comprises a non-display bending portion that is bent and a non-display non-bending portion that is not bent, wherein the optical plate comprises a first portion covering the display area and a second portion covering the non-display bending area.

In the foregoing device, the second portion of the optical plate may further cover a portion of the non-display non-bending portion. The first portion of the optical plate may have a thickness greater than that of the second portion of the optical plate. The non-display area may comprise a second non-display bending portion, wherein the non-display non-bending portion is disposed between the non-display bending portion and the second non-display bending portion when viewed in a thickness direction of the display panel, wherein the optical plate comprises a third portion covering the second non-display bending area.

A further aspect of the invention provides a display device comprising: a display panel comprising a surface comprising a display area in which an image is displayed and a non-display area in which the image is not displayed; and an optical plate disposed over the display panel and comprising a first optical plate portion covering the display area and a second optical plate portion covering the non-display area, wherein the first optical plate portion has a thickness greater than that of the second optical plate portion.

In the foregoing device, the display panel may further comprise: a bending portion that is bent; and a non-bending portion that is not bent, and the second optical plate portion covers the non-display area and the bending portion. The first optical plate portion may comprise a retardation film which does not comprise a portion in the second optical plate portion.

Embodiments of the inventive concept provide a display device including a display panel and a polarizing plate. The display panel includes a display area in which an image is displayed and a non-display area in which the image is not displayed. The polarizing plate is disposed on the display panel and includes a retardation film overlapped with the display area and not overlapped with the non-display area. The display panel includes a base substrate and lines disposed on the base substrate. The base substrate includes a bending area that is bent and a non-bending area that is not bent. The polarizing plate includes a first polarizing plate and a second polarizing plate. The first polarizing plate covers the display area and the second polarizing plate covers lines among the lines, which are disposed in the bending area and overlapped with the non-display area.

The first polarizing plate includes the retardation film and the second polarizing plate does not include the retardation film.

The first polarizing plate has a thickness greater than a thickness of the second polarizing plate.

The bending area is bent with reference to a bending axis and the second polarizing plate is protruded from the first polarizing plate along a direction substantially in parallel to the bending axis and connected to the first polarizing plate.

The display device further includes a printed circuit board and a tape carrier package. The printed circuit board is electrically connected to the display panel and the tape carrier package connects the display panel and the printed circuit board. The lines include first lines, second lines, third lines, and fourth lines. The first lines are disposed in the bending area and overlapped with the display area. The second lines are overlapped with the non-display area and connected between the first lines and the tape carrier package. The third lines are disposed in the non-bending area and overlapped with the display area. The fourth lines are overlapped with the non-display area and connected between the third lines and the tape carrier package. The first polarizing plate covers the first lines and the third lines, and the second polarizing plate covers at least a portion of the second lines.

The bending area is bent with reference to a bending axis extending substantially parallel to a first direction and the display area has a substantially rectangular shape. The non-display area surrounds the display area and includes first, second, third, and fourth non-display areas. The first non-display area is overlapped with the tape carrier package. The second non-display area is spaced apart from the first non-display area in the first direction. The third non-display area is connected to the first and second non-display areas. The fourth non-display area is spaced apart from the third non-display area in a second direction crossing the first direction, and the second polarizing plate covers the first non-display area.

Each of the second lines includes a first bending line disposed in the bending area and a first non-bending line disposed in the non-bending area, and the second polarizing plate covers the first bending line.

The second polarizing plate further covers at least a portion of the first non-bending line.

The polarizing plate further includes a lower protective film, a polarizer, and an upper protective film. The lower protective film is disposed on the retardation film, the polarizer is disposed on the lower protective film, the upper protective film is disposed on the polarizer, and the polarizer is disposed on the first and second polarizing plates.

The polarizer has an area greater than an area of the retardation film when viewed in a thickness direction of the display panel.

Each of the upper protective film and the lower protective film is disposed on the first and second polarizing plates.

The lower protective film is disposed on the first polarizing plate without being disposed on the second polarizing plate and the upper protective film is disposed on the first and second polarizing plates.

The polarizing plate further includes a phase pressure-sensitive adhesive layer disposed between the lower protective film and the retardation film.

The display device further includes a polarization pressure-sensitive adhesive layer disposed between the display panel and the polarizing plate. The polarization pressure-sensitive adhesive layer includes first and second polarization pressure-sensitive adhesive layers. The first polarization pressure-sensitive adhesive layer is overlapped with the first polarizing plate and the second polarization pressure-sensitive adhesive layer is overlapped with the second polarizing plate. The second polarization pressure-sensitive adhesive layer has a thickness equal to or greater than a thickness of the first polarization pressure-sensitive adhesive layer.

The first polarizing plate has a substantially rectangular shape and the second polarizing plate is connected to an end portion of a side portion of the first polarizing plate.

The second polarizing plate has a polygonal shape, a circular shape, a semi-circular shape, or an oval shape.

Embodiments of the inventive concept provide a display device including a display panel and a polarizing plate. The display panel includes a display area in which an image is displayed and a non-display area in which the image is not displayed. The polarizing plate is disposed on the display panel and includes a retardation film overlapped with the display area and not overlapped with the non-display area. The non-display area includes a non-display bending area that is bent and a non-display non-bending area that is not bent, and the polarizing plate covers the display area and the non-display bending area.

The polarizing plate further covers at least a portion of the non-display non-bending area.

The polarizing plate further includes a first polarizing plate and a second polarizing plate. The first polarizing plate covers the display area and the second polarizing plate covers the non-display bending area. The first polarizing plate has a thickness greater than a thickness of the second polarizing plate.

The display panel further includes a bending area that is bent with reference to a bending axis extending substantially parallel to a first direction and a non-bending area that is not bent. The bending area includes a first bending area and a second bending area. The first bending area includes a first non-display bending area in which the image is not displayed. The second bending area is spaced apart from the first bending area in a second direction crossing the first direction and includes a second non-display bending area in which the image is not displayed. The second polarizing plate includes a first sub-polarizing plate covering the first non-display bending area and a second sub-polarizing plate covering the second non-display bending area.

Embodiments of the inventive concept provide a display device including a display panel and a polarizing plate. The display panel includes a display area in which an image is displayed and a non-display area in which the image is not displayed. The polarizing plate is disposed on the display panel and includes a first polarizing plate covering the display area and a second polarizing plate covering the non-display area. The first polarizing plate has a thickness greater than a thickness of the second polarizing plate.

The display panel further includes a bending area that is bent and a non-bending area that is not bent. The second polarizing plate covers the non-display area and the bending area.

The first polarizing plate includes a retardation film and the second polarizing plate does not include the retardation film.

According to the above, the display device may reduce the crack occurring therein and improve the reliability thereof.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1A:
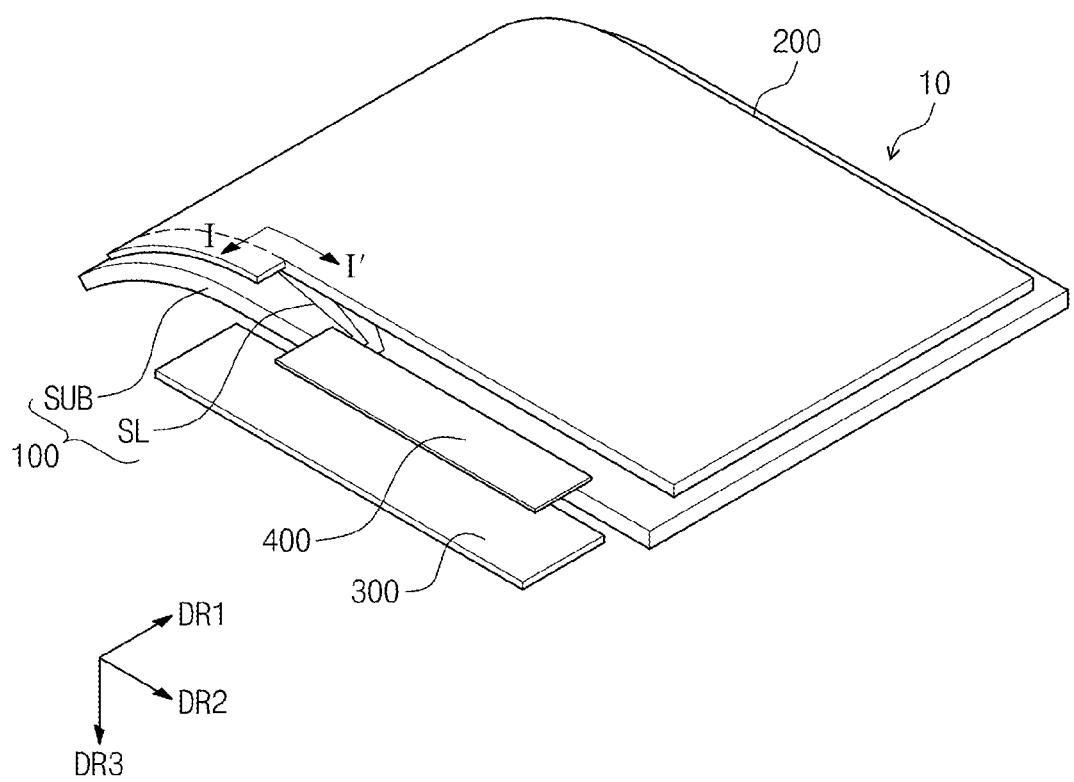
FIG. 1A is a perspective view showing a display device according to an embodiment of the present disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers, portions and/or sections, these elements, components, regions, layers, portions and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present invention will be explained in detail with reference to the accompanying drawings.

Figure 1B:
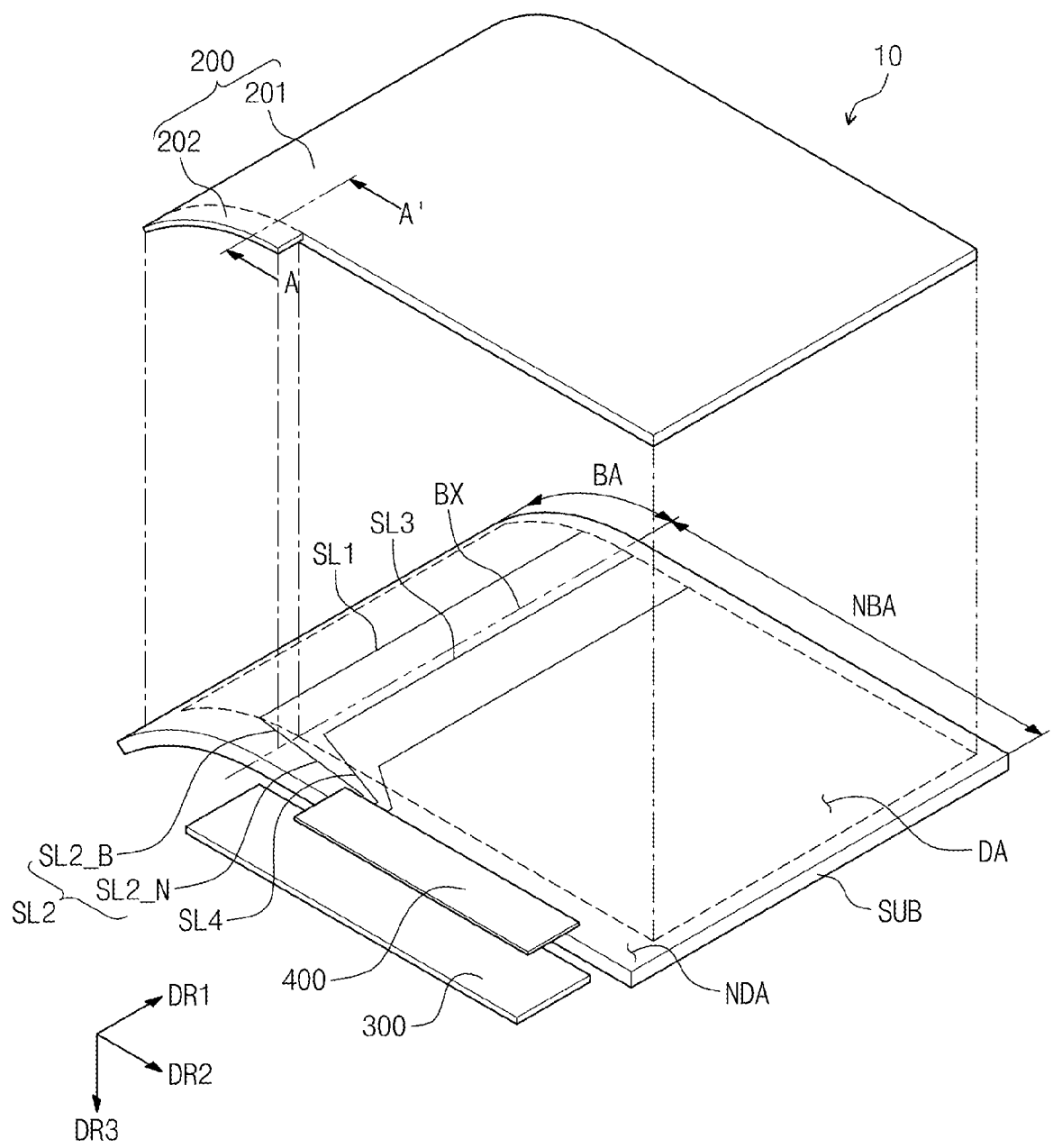
FIG. 1B is an exploded perspective view showing a display device according to an embodiment of the present disclosure.
Figure 1C:
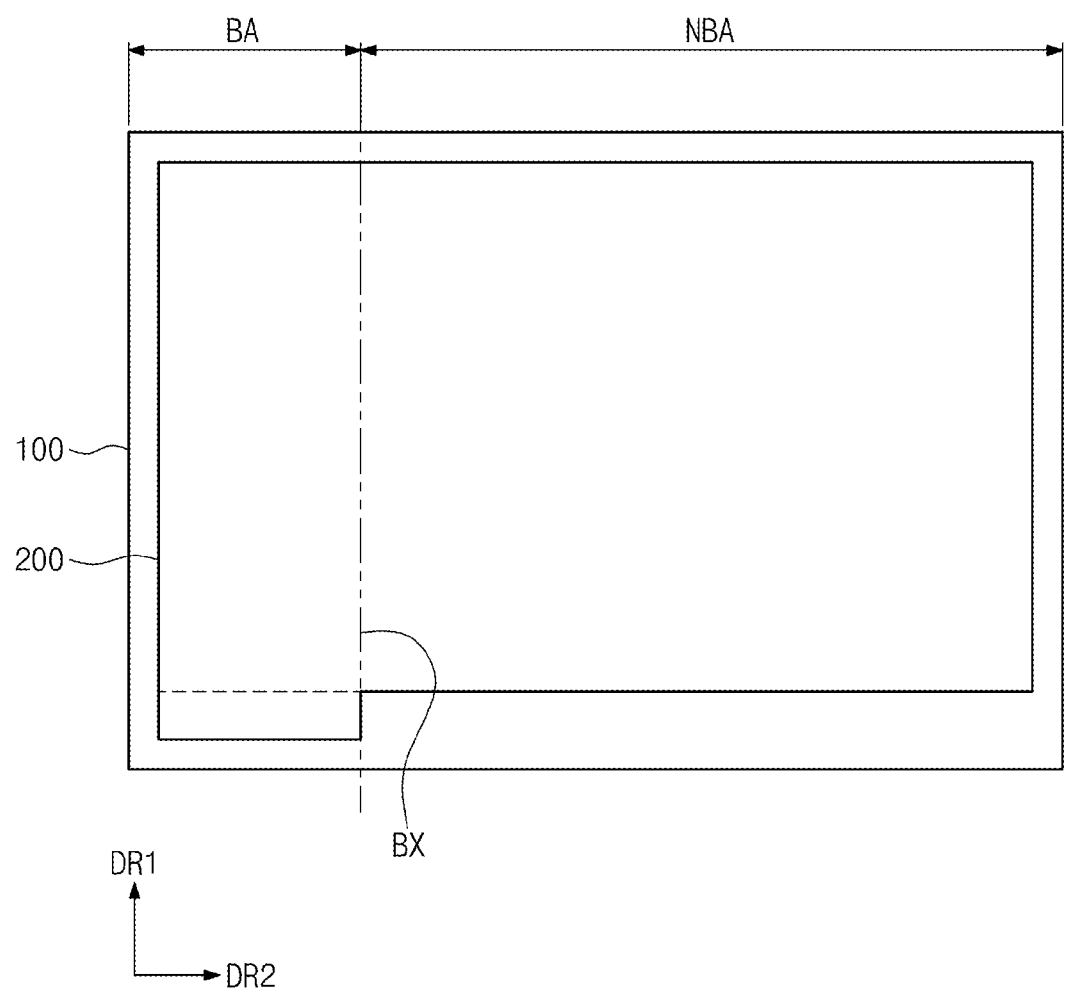
FIG. 1C is a plan view showing a display device according to an embodiment of the present disclosure.

FIG. 1A is a perspective view showing a display device according to an embodiment of the present disclosure, FIG. 1B is an exploded perspective view showing a display device according to an embodiment of the present disclosure, and FIG. 1C is a plan view showing a display device according to an embodiment of the present disclosure.

Figure 2A:
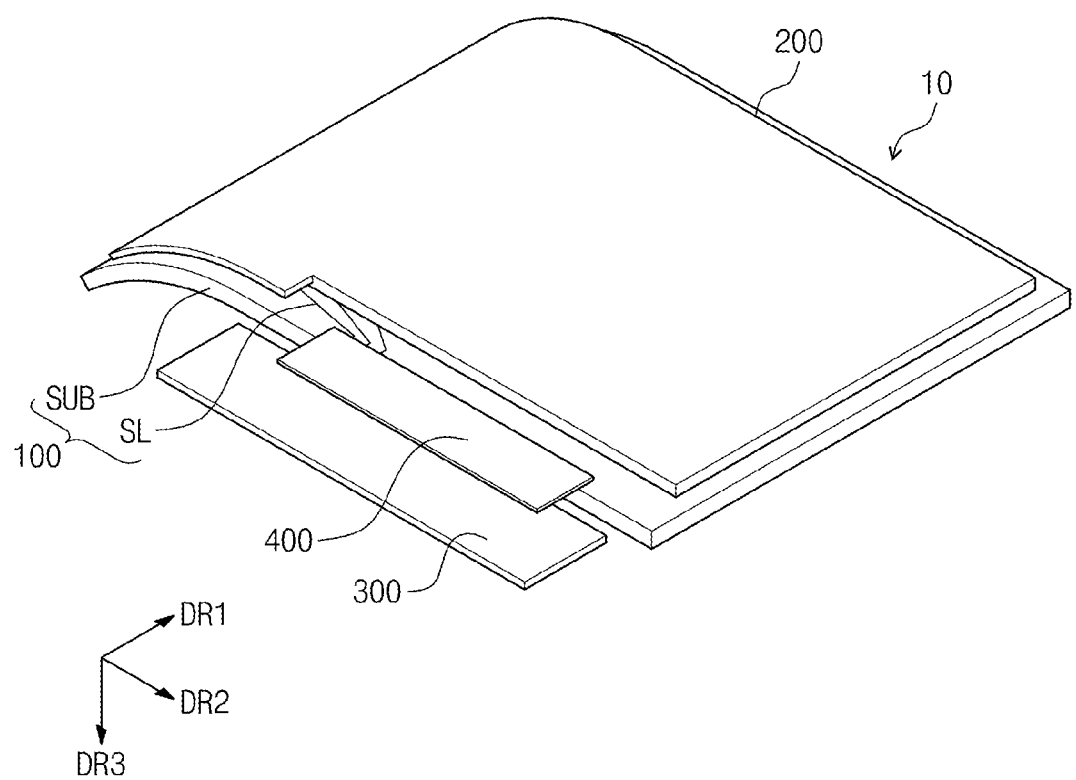
FIG. 2A is a perspective view showing a display device according to an embodiment of the present disclosure.
Figure 2B:
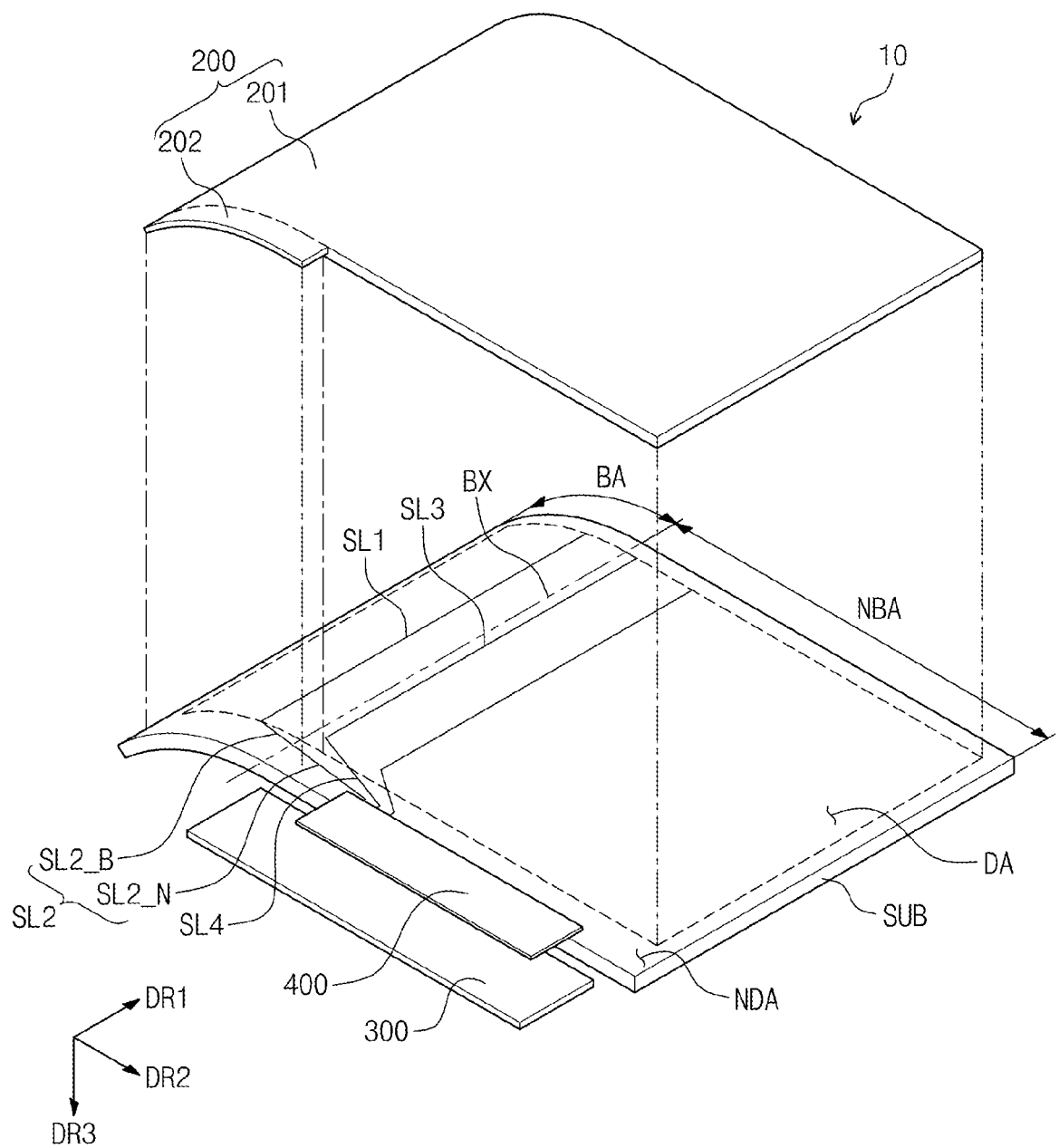
FIG. 2B is an exploded perspective view showing a display device according to an embodiment of the present disclosure.
Figure 2C:
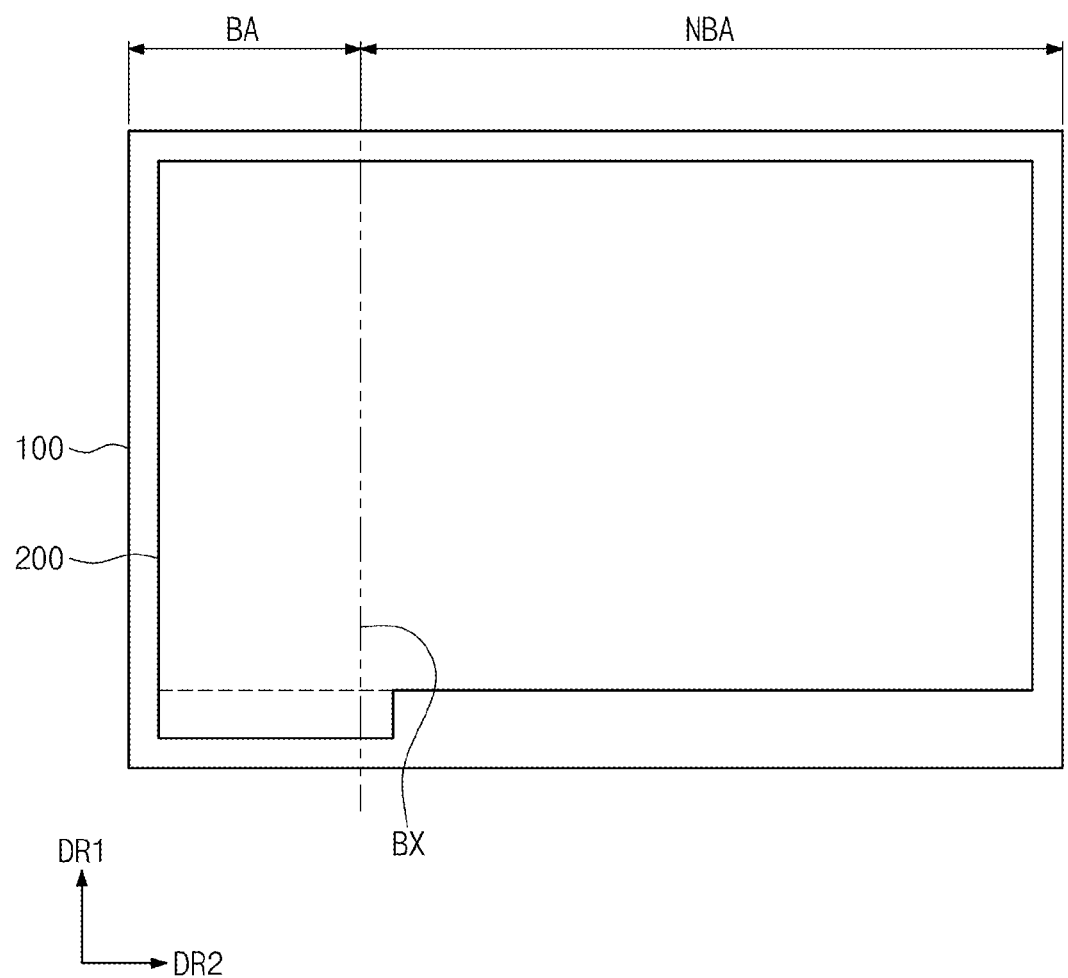
FIG. 2C is a plan view showing a display device according to an embodiment of the present disclosure.
Figure 3:
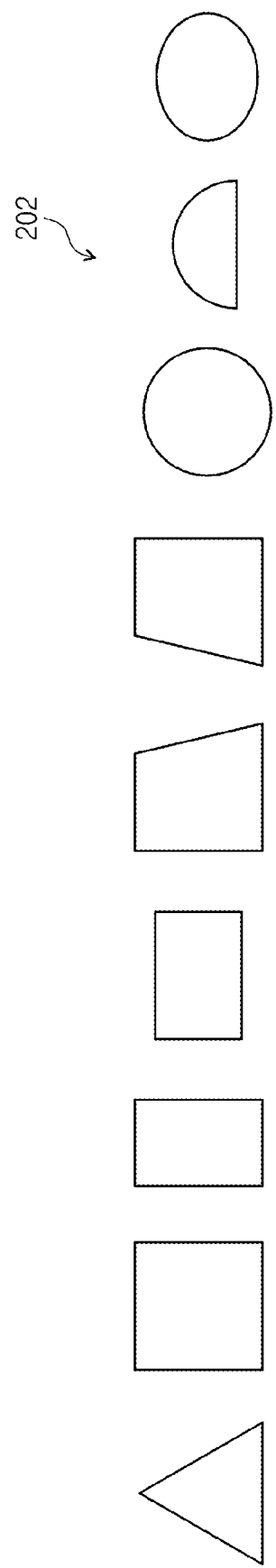
FIG. 3 shows various shapes of a second optical plate included in a display device according to an embodiment of the present disclosure.

FIG. 2A is a perspective view showing a display device according to an embodiment of the present disclosure, FIG. 2B is an exploded perspective view showing a display device according to an embodiment of the present disclosure, and FIG. 2C is a plan view showing a display device according to an embodiment of the present disclosure. FIG. 3 shows various shapes of a second optical plate included in a display device according to an embodiment of the present disclosure.

Referring to FIGS. 1A to 1C and 2A to 2C, a display device 10 includes a display panel 100 and an optical plate or sheet 200. The display device 10 further includes a printed circuit board 300 and a tape carrier package 400.

The display panel 100 may be, but not limited to, flexible. Various display panels, such as an organic light emitting display panel, a liquid crystal display panel, an electrophoretic display panel, an electrowetting display panel, etc., may be used as the display panel 100 as long as the display panel 100 is bendable.

The display panel 100 has a substantially rectangular shape when viewed in a thickness direction DR3 (hereinafter, referred to as a third direction) of the display panel 100, but the shape of the display panel 100 should not be limited to the rectangular shape. In FIGS. 1A to 1C and 2A to 2C, a long side of the display panel 100 extends in a direction DR2 (hereinafter, referred to as a second direction) crossing a bend line BX, but it should not be limited thereto or thereby. That is, the long side of the display panel 100 may extend in a direction DR1 (hereinafter, referred to as a first direction) substantially in parallel to the bend line BX.

Figure 1D:
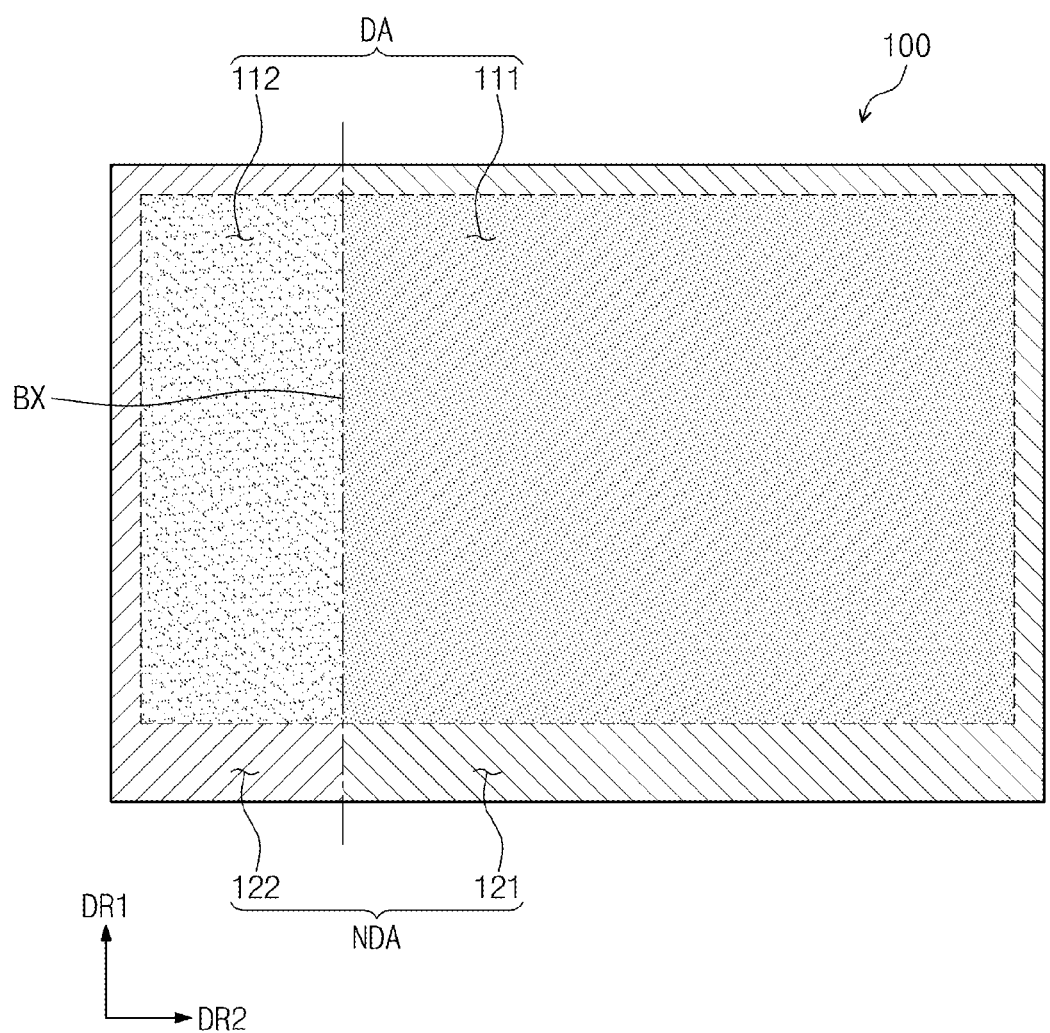
FIGS. 1D and 1E are plan views showing a display panel included in a display device according to an embodiment of the present disclosure.
Figure 1E:
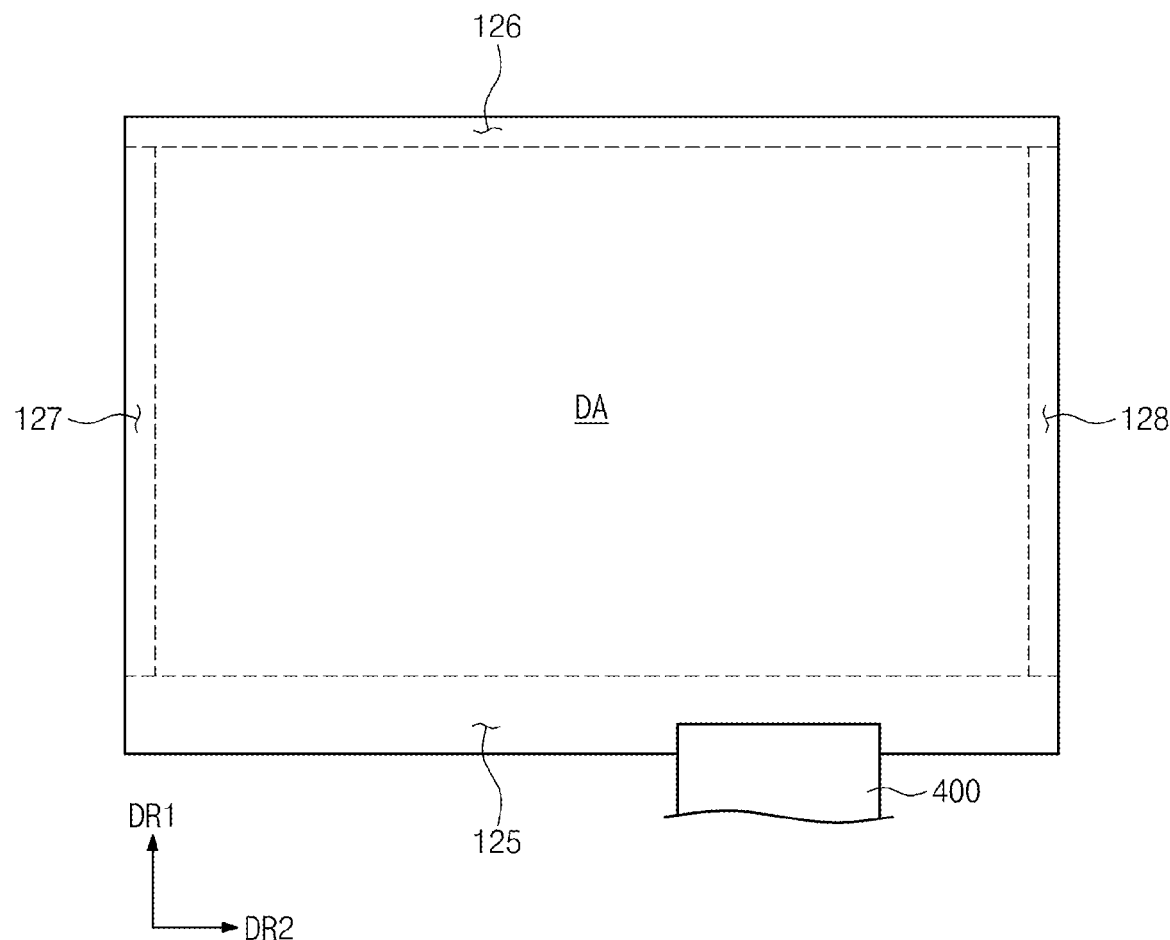

FIGS. 1D and 1E are plan views showing a display panel included in a display device according to an embodiment of the present disclosure.

Referring to FIGS. 1D and 1E, the display panel 100 includes a display surface which includes a display area DA and a non-display area NDA surrounding the display area DA. The display area DA has a substantially rectangular shape when viewed in the third direction DR3 (refer to FIGS. 1A, 1B, 2A, and 2B) of the display panel 100, but the shape of the display area DA should not be limited to the rectangular shape.

The display area DA displays an image. The display panel 100 includes a display non-bending portion 111 and a display bending portion 112 which overlap the display area DA. The display non-bending portion 111 displays the image and is not bent. The display bending portion 112 displays the image and is bent. The display non-bending portion 111 and the display bending portion 112 are disposed next to each other in the second direction DR2 and connected to each other.

The display panel 100 further includes a non-display non-bending portion 121 and a non-display bending portion 122 which overlap the non-display area NDA. The non-display non-bending portion 121 does not display the image and is not bent. The non-display bending portion 122 does not display the image and is bent. The non-display non-bending portion 121 and the non-display bending portion 122 are disposed next to each other in the second direction DR2 and connected to each other.

The non-display area NDA includes a first non-display area 125, a second non-display area 126, a third non-display area 127, and a fourth non-display area 128.

The first non-display area 125 is overlapped with the tape carrier package 400. The second non-display area 126 is spaced apart from the first non-display area 125 in the first direction DR1. The third non-display area 127 is connected to the first and second non-display areas 125 and 126. In embodiments, the third non-display area 127 is included in the bending portion. The fourth non-display area 128 is spaced apart from the third non-display area 127 in the second direction DR2 and is connected to the first and second non-display areas 125 and 126.

Referring to FIGS. 1A to 1E and 2A to 2C, the display panel 100 includes a base substrate SUB and electrically conductive lines SL disposed on the base substrate SUB. The display panel 100 includes an array of pixels electrically connected to the lines SL. Each of the pixels includes at least one thin film transistor. The array of pixels are arranged in the display area DA. In embodiments, boundaries of the display area DA may be defined by outermost pixels of the array.

The base substrate SUB may be a glass substrate, a quartz substrate, or a plastic substrate. The base substrate SUB is a transparent insulating substrate. In embodiments, the base substrate SUB is flexible.

The display panel includes a bending portion BA and a non-bending portion NBA. The bending portion BA is bent with reference to the bend line BX and the non-bending portion NBA is not bent. The bend line BX is substantially in parallel to the first direction DR1. The non-bending portion NBA is connected to the bending portion BA in the second direction DR2. In embodiments, the bending portion BA has a bent or curved shape while the non-bending portion NBA is flat.

The lines SL are configured to include first lines SL1, second lines SL2, third lines SL3, and fourth lines SL4. The first lines SL1 are disposed in the bending portion BA and overlapped with the display area DA. The first lines SL1 extend in the first direction DR1 substantially parallel to the bend line BX, but they should not be limited thereto or thereby. That is, the first lines SL1 may extend in a direction not parallel to the bend line BX. In addition, a portion of each of the first lines SL1 may extend in the first direction DR1 substantially in parallel to the bend line BX and the other portion of each of the first lines SL1 may extend in the direction not parallel to the bend line BX. The first lines SL1 may extend in different directions from each other or may extend substantially in parallel to each other.

The second lines SL2 are overlapped with the non-display area NDA and connected between the first lines SL1 and the tape carrier package 400. The second lines SL2 extend in a direction different from the bend line BX, but they should not be limited thereto or thereby. That is, a portion of each of the second lines SL2 may extend in the first direction DR1 substantially in parallel to the bend line BX and the other portion of each of the second lines SL2 may extend in a direction not parallel to the bend line BX.

The second lines SL2 may extend in different directions from each other or may extend substantially in parallel to each other.

Each of the second lines SL2 includes a first bending line portion SL2_B and a non-bending line portion SL2_N. The first bending line portion SL2_B is disposed in the bending portion BA and the non-bending line portion SL2_N is disposed in the non-bending portion NBA.

The third lines SL3 are disposed in the non-bending portion NBA and overlapped with the display area DA. A portion of each of the third lines SL3 may extend in the first direction DR1 substantially in parallel to the bend line BX and the other portion of each of the third lines SL3 may extend in a direction not parallel to the bend line BX, but they should not be limited thereto or thereby. That is, the third lines SL3 may extend in the first direction DR1 substantially in parallel to the bend line BX. In addition, the third lines SL3 may extend in a direction different from the bend line BX. The third lines SL3 may extend in different directions from each other or may extend substantially in parallel to each other.

The fourth lines SL3 are overlapped with the non-display area NDA and connected between the third lines SL3 and the tape carrier package 400. The fourth lines SL4 may extend in a direction different from the bend line BX, but they should not be limited thereto or thereby. That is, a portion of each of the fourth lines SL4 may extend in the first direction DR1 substantially in parallel to the bend line BX and the other portion of each of the fourth lines SL4 may extend in a direction not parallel to the bend line BX. The fourth lines SL4 may extend in different directions from each other or may extend substantially in parallel to each other.

The printed circuit board 300 is electrically connected to the display panel 100. The printed circuit board 300 applies a driving signal to the display panel 100. The printed circuit board 300 includes a driving part, but it should not be limited thereto or thereby. That is, the driving part may be included in the tape carrier package 400 or the display panel 100 rather than the printed circuit board 300.

The driving part generates the driving signal to drive the display panel 100 in response to an external signal. The driving part is electrically connected to the lines SL of the display panel 100 and applies the driving signal to the lines SL. The external signal is provided from the printed circuit board 300 and includes various signals, such as image signals, control signals, a driving voltage, etc. The driving signal includes a gate signal applied to a gate line and a data signal applied to a data line.

The driving part includes a data driver that converts the image signal to the data signal and applies the data signal to the display panel 100 and a gate driver that converts the image signal to the gate signal and applies the gate signal to the display panel 100, but it should not be limited thereto or thereby. That is, each of the data driver and the gate driver may be integrated in a chip shape and mounted on the tape carrier package 400, or each of the data driver and the gate driver may be mounted on the display panel 100 in a chip-on-glass manner.

The tape carrier package 400 connects the display panel 100 and the printed circuit board 300. The tape carrier package 400 may be provided in a plural number.

The optical plate 200 is disposed on or over the display panel 100. In embodiments, the optical plate 200 is attached to the display panel with an adhesive. The optical plate 200 includes a first optical plate portion 201 and a second optical plate portion 202. The first optical plate portion 201 is connected to the second optical plate portion 202 in the first direction DR1.

Figure 1F:
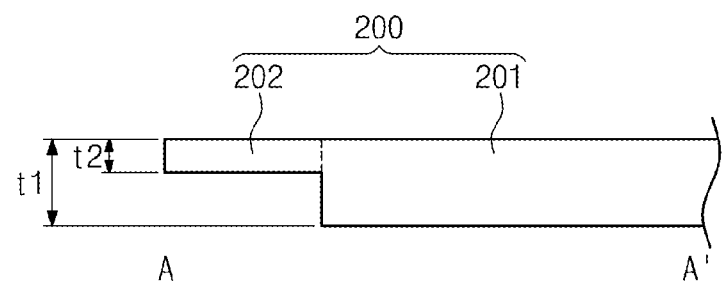
FIG. 1F is a cross-sectional view taken along a line A-A' shown in FIG. 1B.

FIG. 1F is a cross-sectional view taken along a line A-A' shown in FIG. 1B.

Referring to FIG. 1F, the first optical plate portion 201 has a thickness t1 thicker than a thickness t2 of the second optical plate portion 202. The thicknesses t1 and t2 of the first and second optical plate portions 201 and 202 will be described in detail later.

Referring to FIGS. 1A to 1C and 2A to 2C again, when viewed in the third direction DR3 of the display panel, the first optical plate portion 201 has a substantially rectangular shape and the second optical plate portion 202 is connected to an end portion of a side portion of the first optical plate portion 201.

The second optical plate portion 202 may have various shapes as long as the second optical plate portion 202 may cover the first bending line portion SL2_B. Referring to FIG. 3, the second optical plate portion 202 may have a polygonal shape, a circular shape, a semi-circular shape, or an oval shape when viewed in the third direction DR3.

Referring to FIGS. 1A to 1C and 2A to 2C again, the optical plate 200 covers the display area DA and at least a portion of the non-display area NDA. The optical plate 200 covers the display area DA and at least a portion of the first non-display area 125. Referring to FIGS. 1A to 1C, the optical plate 200 covers the display area DA and the non-display bending portion 122. Referring to FIGS. 2A to 2C, the optical plate 200 further covers at least a portion of the non-display non-bending portion 121.

Referring to FIGS. 1A to 1C and 2A to 2C again, the first optical plate portion 201 covers the display area DA and the second optical plate portion 202 covers the non-display area NDA. In detail, the second optical plate portion 202 covers the non-display bending portion 122. The second optical plate portion 202 may further cover at least a portion of the non-display non-bending portion 121.

The first optical plate portion 201 covers the first lines SL1 and the third lines SL3 and the second optical plate portion 202 covers at least a portion of the second lines SL2. Referring to FIGS. 1A to 1C, the second optical plate portion 202 covers the first bending line portion SL2_B. Referring to FIGS. 2A to 2C, the second optical plate portion 202 further covers at least a portion of the first non-bending line portion SL2_N. That is, the second optical plate portion 202 covers at least a portion of the first non-bending line portion SL2_N and the first bending line portion SL2_B.

Figure 4:
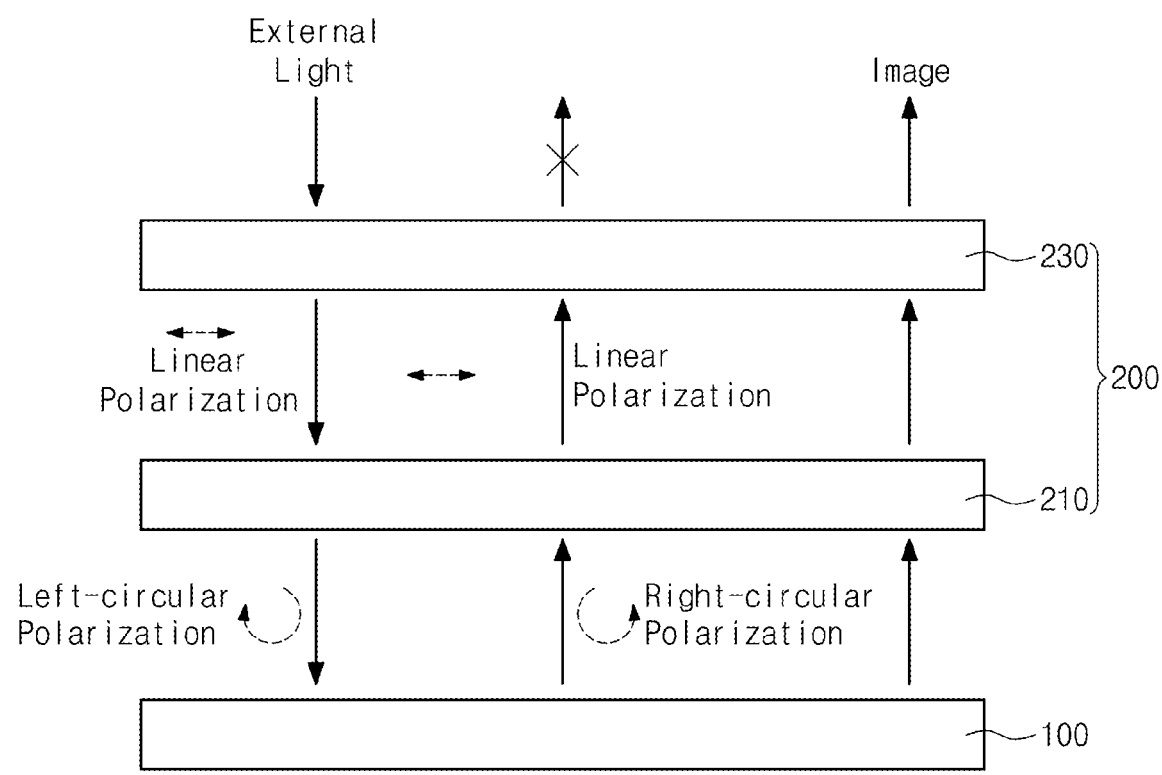
FIG. 4 is a cross-sectional view explaining a function of an optical plate included in a display device according to an embodiment of the present disclosure.

FIG. 4 is a cross-sectional view explaining a function of the optical plate 200 included in the display device 10 according to an embodiment of the present disclosure.

Referring to FIG. 4, the optical plate 200 is disposed on or over the display panel 100 to allow a user to perceive the image displayed by a display light exiting from the display panel 100 and to prevent the user from perceiving an external light. The optical plate 200 includes a retardation film 210 and a polarizer 230. The polarizer 230 has an optical axis that forms an angle of about 45 degrees with an optical axis of the retardation film 210.

Hereinafter, the organic light emitting display panel will be described as the display panel 100 included in the display device 10 according to the present embodiment. The organic light emitting display panel includes a light emitting layer. Light emitted from the light emitting layer is circularly polarized while passing through the retardation film 210. The circularly-polarized light is linearly polarized while passing through the polarizer 230. Therefore, the user perceives the image displayed by the display light.

The external light, which is a natural light, is linearly polarized while passing through the polarizer 230 in a horizontal direction. The linearly-polarized light is left-circularly polarized by the retardation film 210. The left-circularly polarized light is reflected by the organic light emitting display panel and right-circularly polarized. The right-circularly polarized light is linearly polarized while passing through the retardation film 210. The linearly-polarized light is blocked by the polarizer 230 in the horizontal direction, and thus the linearly-polarized light does not exit to the outside. Thus, the user does not perceive the external light incident to the organic light emitting display panel.

The polarizer 200 mixes the external light and the display light exiting from the organic light emitting display panel, and thus the user clearly perceives the image displayed by the light.

Figure 5A:
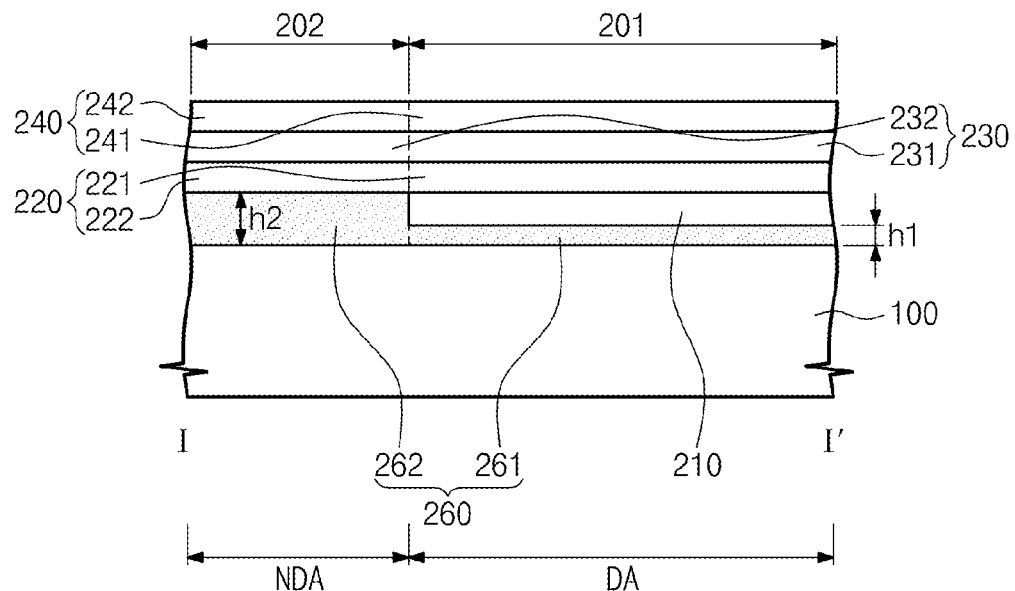
FIGS. 5A and 5B are cross-sectional views taken along a line I-I' shown in FIG. 1A.
Figure 5B:
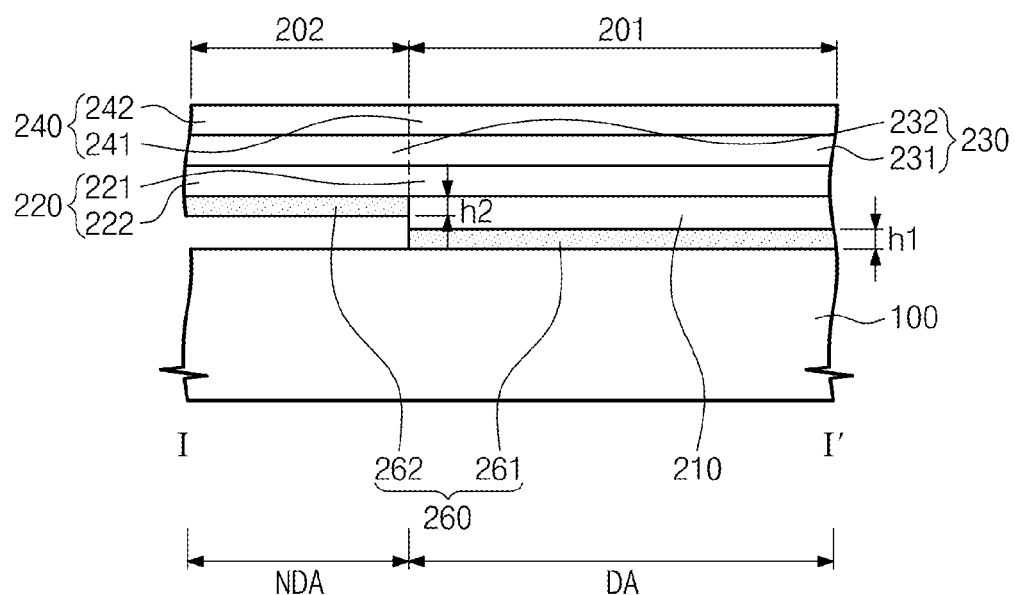
Figure 6A:
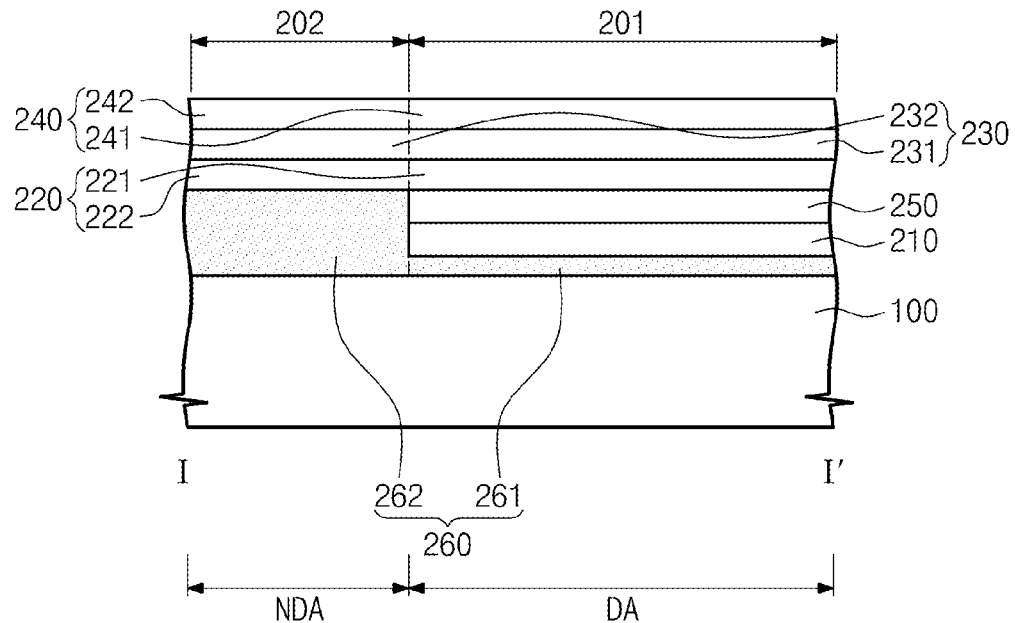
FIGS. 6A and 6B are cross-sectional views taken along a line I-I' shown in FIG. 1A.
Figure 6B:
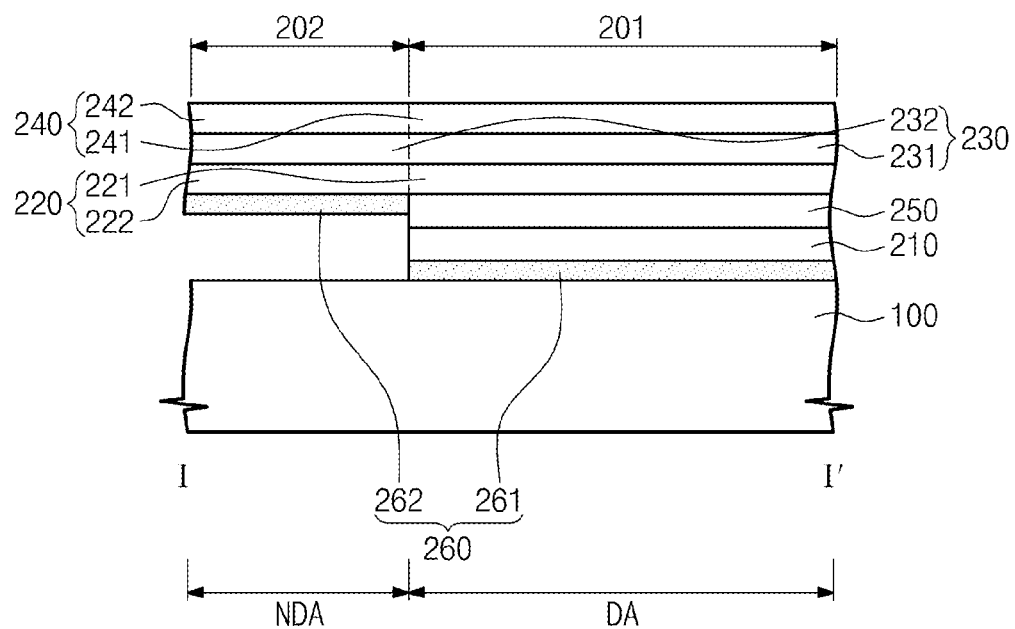
Figure 7A:
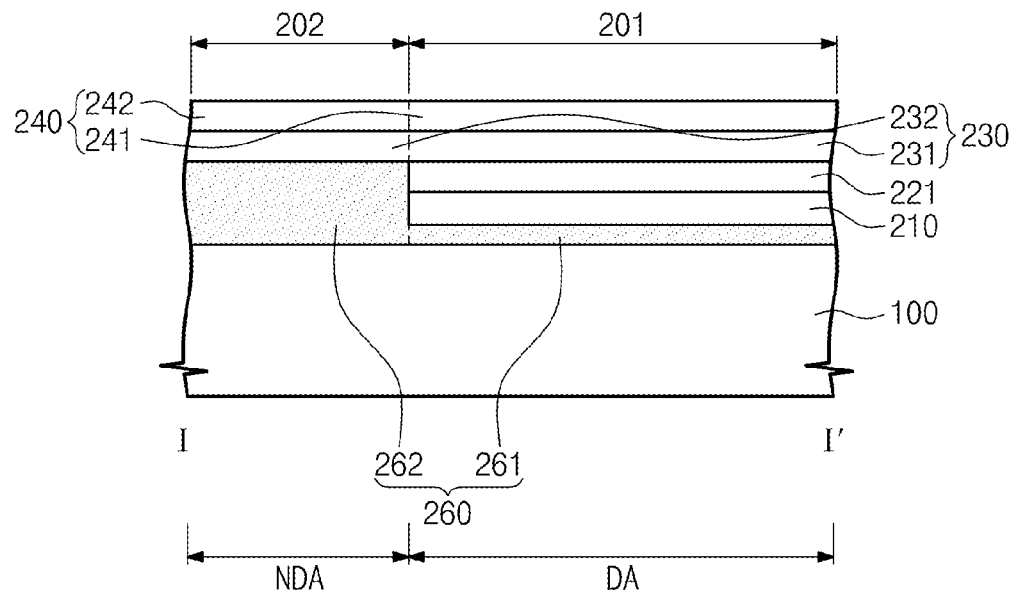
FIGS. 7A and 7B are cross-sectional views taken along a line I-I' shown in FIG. 1A.
Figure 7B:
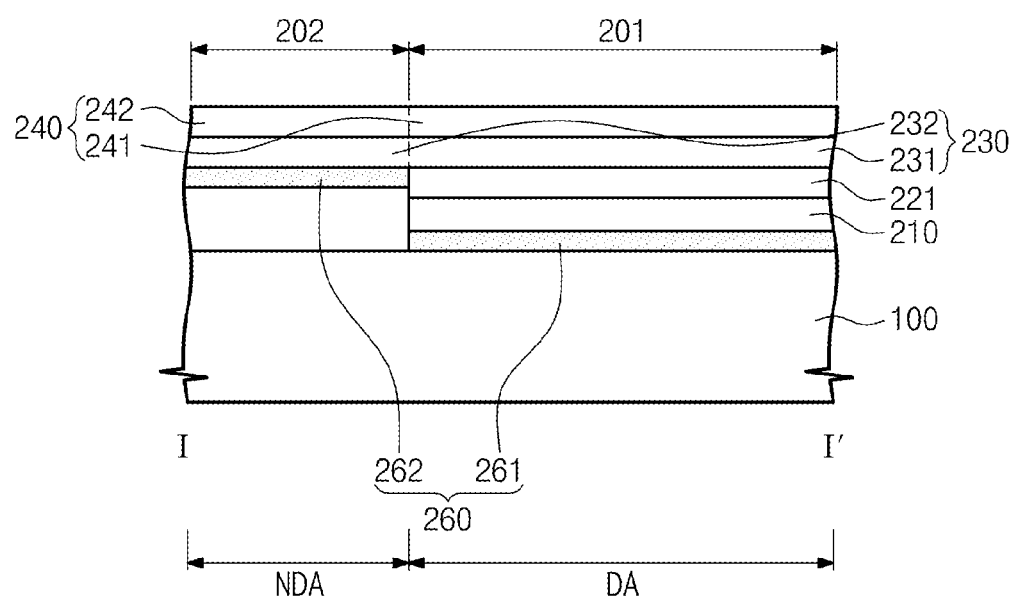
Figure 8A:
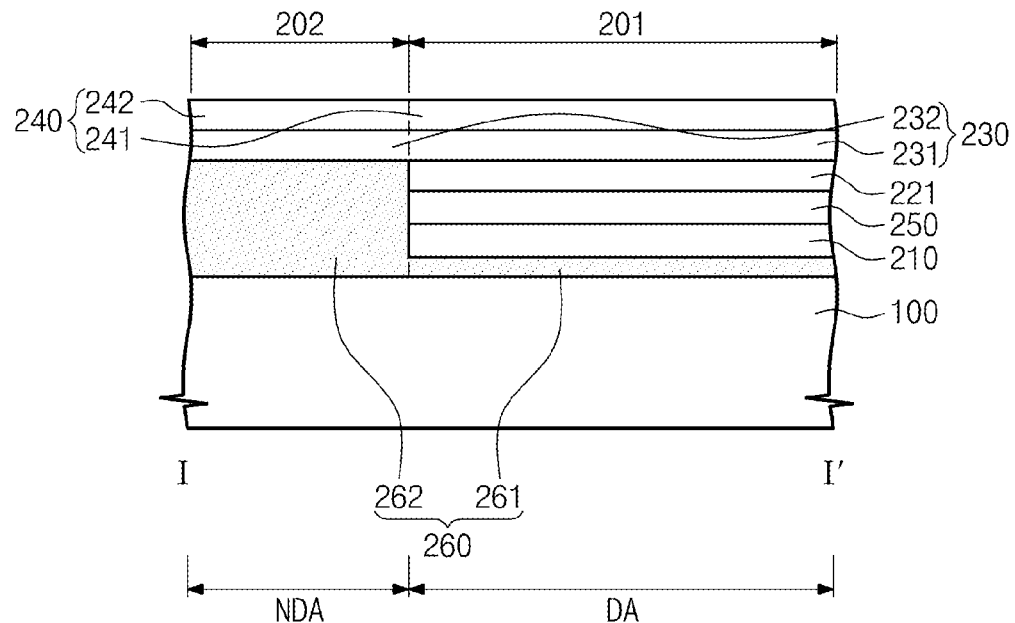
FIGS. 8A and 8B are cross-sectional views taken along a line I-I' shown in FIG. 1A.
Figure 8B:
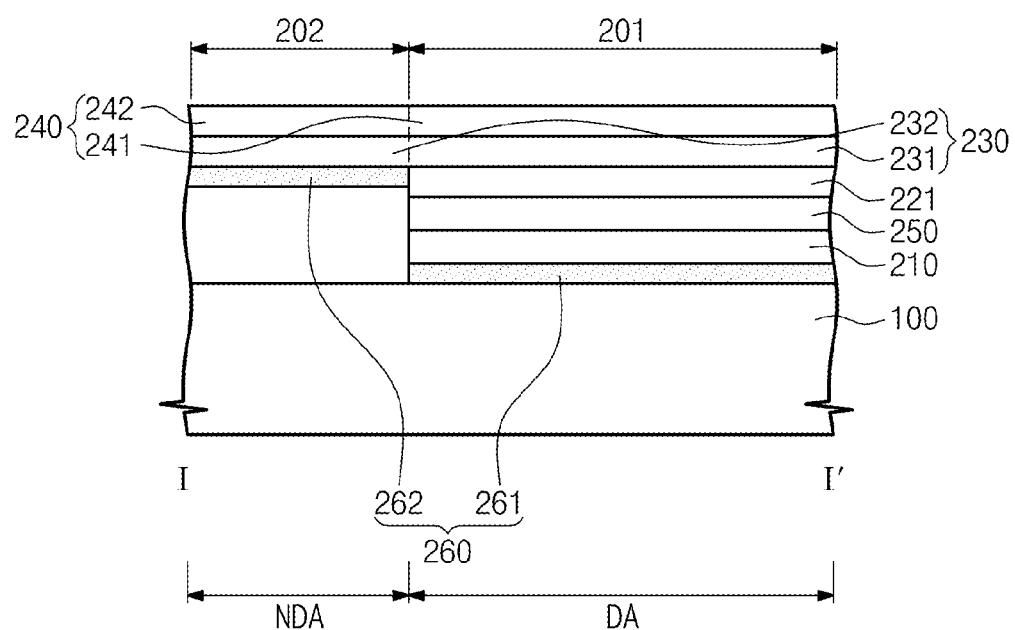

FIGS. 5A and 5B are cross-sectional views taken along a line I-I' shown in FIG. 1A, FIGS. 6A and 6B are cross-sectional views taken along a line I-I' shown in FIG. 1A, FIGS. 7A and 7B are cross-sectional views taken along a line I-I' shown in FIG. 1A, and FIGS. 8A and 8B are cross-sectional views taken along a line I-I' shown in FIG. 1A.

Referring to FIGS. 5A, 5B, 6A, 6B, 7A, 7B, 8A, and 8B, the first optical plate portion 201 includes the retardation film 210, a first lower protective film portion 221, a first polarizer portion 231, and a first upper protective film portion 241. The first lower protective film portion 221 is disposed on the retardation film 210. The first polarizer portion 231 is disposed on the first lower protective film portion 221. The first upper protective film portion 241 portion is disposed on the first polarizer portion 231. The first optical plate portion 201 has the thickness t1 (refer to FIG. 1F) thicker than the thickness t2 (refer to FIG. 1F) of the second optical plate portion 202. Each of the retardation film 210, the first lower protective film portion 221, the first polarizer portion 231, and the first upper protective film portion 241 may be provided in a plural number.

The second optical plate portion 202 includes a second lower protective film portion 222, a second polarizer portion 232, and a second upper protective film portion 242. In embodiments, the first and second lower protective film portions 221 and 222 are formed as a single layer, a lower protective film 220. The first and second polarizer portions 231 and 232 are formed as a single layer, a polarizer 230. The first and second upper protective film portions 241 and 242 are formed as a single layer, an upper protective film 240. The second optical plate portion 202 does not include any retardation film portion. In embodiments, the retardation film does not include a portion in the second optical plate portion 202. The second polarizer portion 232 is disposed on the second lower protective film portion 222. The second upper protective film portion 242 is disposed on the second polarizer portion 232. However, referring to FIGS. 6A, 6B, 8A, and 8B, the second lower protective film portion 222 may be omitted. In embodiments, the lower protective film does not include a portion in the second optical plate portion 202. In embodiments, the second lower protective film portion 222, the second polarizer portion 232, and the second upper protective film portion 242 may be provided in a plural number.

Referring to FIGS. 5A, 5B, 6A, 6B, 7A, 7B, 8A, and 8B again, the retardation film 210 has a polarizing axis or a slow axis to retard a phase of light vibrating along the polarizing axis or the slow axis. Accordingly, the linearly-polarized light is circularly polarized or the circularly-polarized light is linearly polarized. The retardation film 210 may be a λ/4 retardation plate, which is called a λ/4 wave plate (QWP), but it should not be limited thereto or thereby.

The retardation film 210 is overlapped with the display area DA and not overlapped with the non-display area NDA. When the retardation film 210 is not overlapped with the display area DA, the display light is mixed with the external light, and thus the user is difficult to clearly perceive the image. However, since the display light does not exit from the non-display area NDA, the display light is not mixed with the external light even though the retardation film 210 is not overlapped with the non-display area NDA. Accordingly, in the display device 10 according to the present embodiment, the retardation film 210 is disposed only in the first optical plate portion 201 that covers the display area DA without being disposed in the second optical plate portion 202. Since the second optical plate portion 202 covers the non-display area NDA, the display light is not mixed with the external light, and as described later, the crack caused by bending the display panel 100 may be reduced even though the retardation film 210 is not disposed in the second optical plate portion 202. In addition, since the retardation film 210 is disposed only in the first optical plate portion 201 and not disposed in the second optical plate portion 202 in the display device 10 (refer to FIG. 1A), a manufacturing cost of the display device 10 may be reduced.

Further, a pressure-sensitive adhesive layer with elasticity may be disposed in the second optical plate portion 202 to correspond to the thickness of the retardation film 210 disposed in the first optical plate portion 201. Since the second optical plate portion 202 covers the bending portion BA, the second optical plate portion 202 requires a high bending flexibility. When the pressure-sensitive adhesive layer having the elasticity higher than that of the retardation film 210 is disposed in the second optical plate portion 202, the second optical plate portion 202 has more improved bending flexibility than that when the retardation film 210 is disposed in the second optical plate portion 202.

The lower protective film 220 is disposed on the retardation film 210. The lower protective film 220 is used to protect the polarizer 230, and the retardation does not occur in the lower protective film 220. The lower protective film 220 is manufactured by a film with superior properties, such as a high transparency, a high mechanical strength, a high thermal stability, a high moisture blocking characteristic, a high isotropy, etc. The lower protective film 220 is formed using at least one of triacetylcellulose (TAC), a discotic liquid-crystal coating layer, a VAC film produced by Sumitomo Kagaku Co., Ltd., cyclo-olefin polymer (COP), cyclo-olefin copolymer (COC), polycarbonate (PC), polyethylene terephthalate (PET), polypropylene (PP), polysulfone (PSF), and polymethylmethacrylate (PMMA), but it should not be limited thereto or thereby.

Referring to FIGS. 5A, 5B, 6A, and 6B, the lower protective film 220 includes the first lower protective film portion 221 and the second lower protective film portion 222. The first lower protective film portion 221 is disposed in the first optical plate portion 201 and the second lower protective film portion 222 is disposed in the second optical plate portion 202. Referring to FIGS. 7A, 7B, 8A, and 8B, the first lower protective film 220 is disposed only in the first optical plate portion 201 and not disposed in the second optical plate portion 202.

Referring to FIGS. 6A, 6B, and 8A, and 8B, the optical plate 200 may further include a phase pressure sensitive adhesive layer 250 disposed between the retardation film 210 and the lower protective film 220. Due to the phase pressure sensitive adhesive layer 250, the retardation film 210 and the lower protective film 220 are adhered to each other.

Referring to FIGS. 5A, 5B, 6A, 6B, 7A, 7B, 8A, and 8B again, the polarizer 230 is disposed on the lower protective film 220. The polarizer 230 converts the natural light to an arbitrary polarized light. When light incident to the polarizer 230 is divided into two polarization components substantially perpendicular to each other, the polarizer 230 transmits one polarization component of the two polarization components and absorbs, reflects or scatters the other polarization component of the two polarization components. The polarizer 230 may be, but not limited to, a polymer film mainly containing a polyvinyl alcohol-based resin containing iodine or dichroic dye, an O-type polarizer formed by aligning a liquid crystal composition containing a dichroic material and a liquid crystal compound in a predetermined direction, or an E-type polarizer formed by aligning a lyotropic liquid crystal in a predetermined direction.

The polarizer 230 covers the display area DA and at least a portion of the second lines SL2 overlapping the non-display area. The polarizer 230 covers the display area DA and the first bending line portion SL2_B. The polarizer 230 covers the display area DA and the first bending line portion SL2_B and further covers the first non-bending line portion SL2_N. Therefore, the polarizer 230 has an area wider than that of the retardation film 210 when viewed in the third direction DR3 (refer to FIGS. 1A, 1B, 2A, and 2B) of the display panel 100.

The polarizer 230 includes the first polarizer portion 231 and the second polarizer portion 232. The first polarizer portion 231 is disposed in the first optical plate portion 201 and the second polarizer portion 232 is disposed in the second optical plate portion 202.

The upper protective film 240 is disposed on the polarizer 230. The upper protective film 240 is used to protect the polarizer 230, and the retardation does not occur in the upper protective film 240. The upper protective film 240 is manufactured by a film with superior properties, such as a high transparency, a high mechanical strength, a high thermal stability, a high moisture blocking characteristic, a high isotropy, etc. The upper protective film 240 is formed using at least one of triacetylcellulose (TAC), a discotic liquid-crystal coating layer, a VAC film produced by Sumitomo Kagaku Co., Ltd., cyclo-olefin polymer (COP), cyclo-olefin copolymer (COC), polycarbonate (PC), polyethylene terephthalate (PET), polypropylene (PP), polysulfone (PSF), and polymethylmethacrylate (PMMA), but it should not be limited thereto or thereby.

The upper protective film 240 includes the first upper protective film portion 241 and the second upper protective film portion 242. The first upper protective film portion 241 is disposed in the first optical plate portion 201 and the second upper protective film portion 242 is disposed in the second optical plate portion 202.

In embodiments, the optical plate 200 may further include a lower pressure-sensitive adhesive layer disposed between the lower protective film 220 and the polarizer 230 to adhere the lower protective film 220 and the polarizer 230.

The display device 10 (refer to FIG. 1A) according to the present embodiment may further include a polarization pressure-sensitive adhesive layer 260 disposed between the display panel 100 and the polarizer 230. The polarization pressure-sensitive adhesive layer 260 includes a first polarization pressure-sensitive adhesive layer 261 and a second polarization pressure-sensitive adhesive layer 262. The first polarization pressure-sensitive adhesive layer 261 is overlapped with the first optical plate portion 201 and the second polarization pressure-sensitive adhesive layer 262 is overlapped with the second optical plate portion 202. For the convenience of explanation, FIGS. 5B, 6B, 7B, and 8B show the second optical plate portion 202 spaced apart from the display panel 100, but at least a portion of the second optical plate portion 202 is adhered to the display panel 100 by the second polarization pressure-sensitive adhesive layer 262. The second optical plate portion 202 may have a curved shape to be adhered to the display panel 100 by the second polarization pressure-sensitive adhesive layer 262.

Referring to FIGS. 5A, 6A, 7A, and 8A, the second polarization pressure-sensitive adhesive layer 262 has a thickness h2 different from a thickness h1 of the first polarization pressure-sensitive adhesive layer 261. The thickness h2 of the second polarization pressure-sensitive adhesive layer 262 is greater than the thickness h1 of the first polarization pressure-sensitive adhesive layer 261. Accordingly, a sum of the thickness of the first optical plate portion 201 and the thickness h1 of the first polarization pressure-sensitive adhesive layer 261 may be equal to a sum of the thickness of the second optical plate portion 202 and the thickness h2 of the second polarization pressure-sensitive adhesive layer 262.

Referring to FIGS. 5B, 6B, 7B, and 8B, the thickness h2 of the second polarization pressure-sensitive adhesive layer 262 may be substantially the same as the thickness h1 of the first polarization pressure-sensitive adhesive layer 261. Therefore, the sum of the thickness of the first optical plate portion 201 and the thickness h1 of the first polarization pressure-sensitive adhesive layer 261 may be greater than the sum of the thickness of the second optical plate portion 202 and the thickness h2 of the second polarization pressure-sensitive adhesive layer 262.

Although not shown in figures, the display device 10 according to the present embodiment may further include at least one of a touch panel, an optical member, a window member, and a protective member. The members may be sequentially stacked on the display panel 100.

Figure 9A:
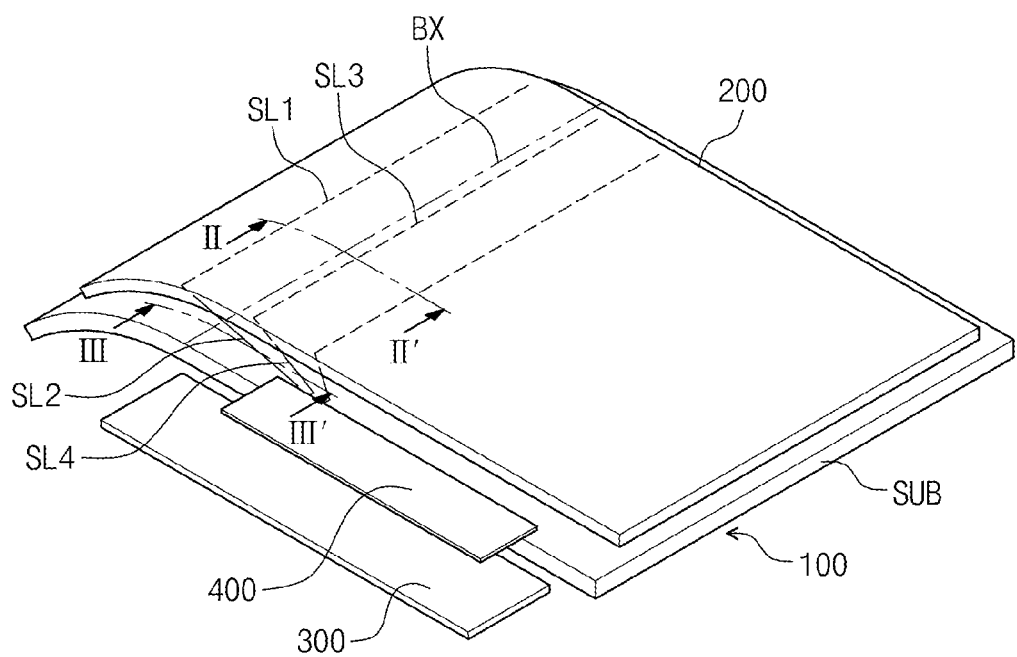
FIG. 9A is a perspective view showing a display device.
Figure 9B:
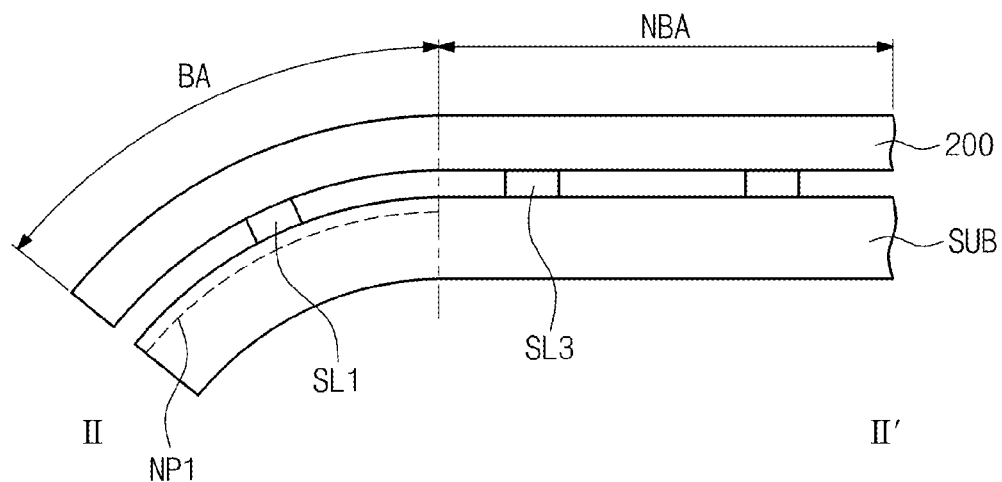
FIG. 9B is a cross-sectional view taken along a line II-II' shown in FIG. 9A.
Figure 9C:
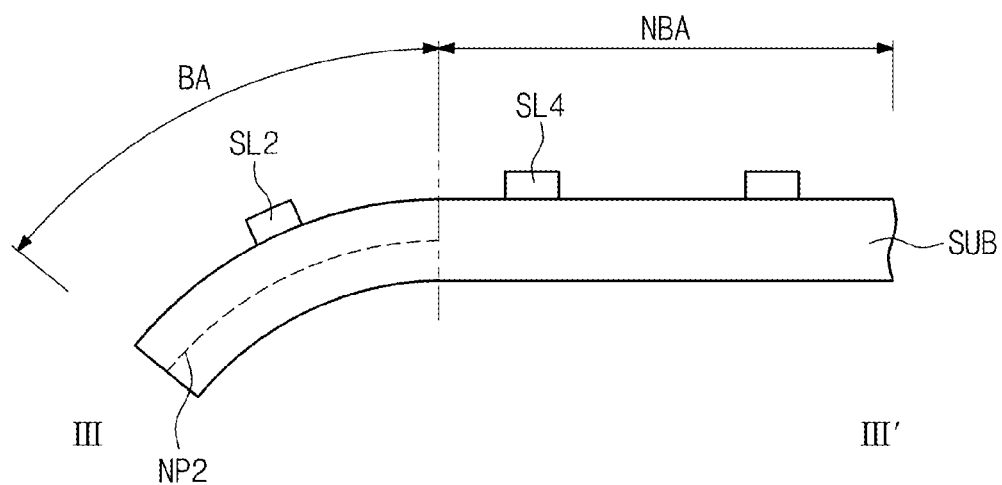
FIG. 9C is a cross-sectional view taken along a line III-III' shown in FIG. 9A.

FIG. 9A is a perspective view showing a typical display device, FIG. 9B is a cross-sectional view taken along a line II-II' shown in FIG. 9A, and FIG. 9C is a cross-sectional view taken along a line III-III' shown in FIG. 9A.

Referring to FIGS. 9A, 9B, and 9C, an optical plate 200 is disposed to overlap a display area DA of the display device and lines SL, which are disposed in a bending portion BA and overlapped with a non-display area NDA. Since a non-bending portion NBA is not bent, lines SL3 and SL4 disposed in the non-bending portion NBA are not influenced by vertical stress, and thus a crack does not occur in the lines SL3 and SL4. However, the bending portion BA is bent, so that lines SL1 and SL2 disposed in the bending portion BA are influenced by the vertical stress. When a display panel 100 is bent, a stable neutral plane is formed inside the display panel 100 since the vertical stress does not occur in the display panel 100. Generally, the neutral plane means that a plane maintains its original length while being bent when a member is applied with an external force. As a distance from the neutral plane becomes small, the vertical stress decreases and the external force becomes small, and as the distance from the neutral plane becomes large, the vertical stress increases and the external force becomes large. Referring to FIG. 9B, among the lines SL1 and SL2 disposed in the bending portion BA, the lines SL1 disposed in the display area DA are disposed closer to the natural-neutral plane NP1, and thus relatively small vertical stress is applied to the lines SL1. Accordingly, the crack does not occur in the lines SU. However, referring to FIG. 9C, since the lines SL2 disposed in the non-display area NDA are disposed father away from the neutral plane NP2, relatively large vertical stress is applied to the lines SL2, and as a result, the crack occurs in the lines SL2. When the crack occurs in the lines SL2, the reliability of the display device is deteriorated.

Figure 10A:
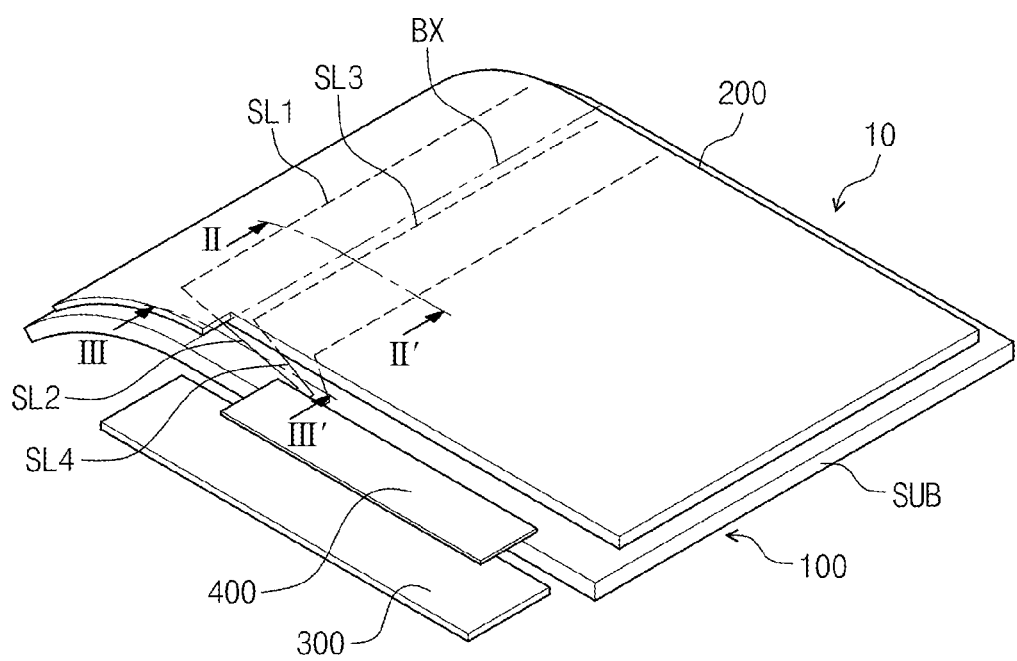
FIG. 10A is a perspective view showing a display device according to an embodiment of the present disclosure.
Figure 10B:
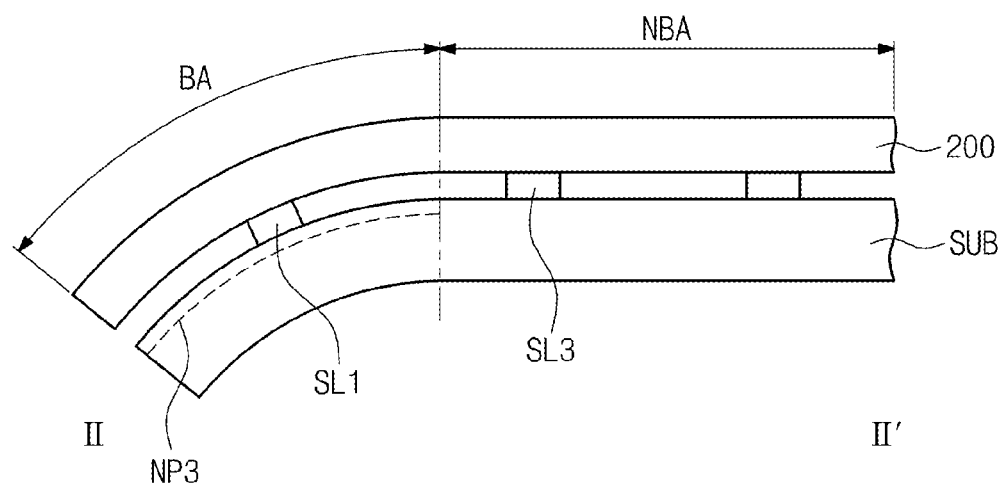
FIG. 10B is a cross-sectional view taken along a line II-II' shown in FIG. 10A.
Figure 10C:
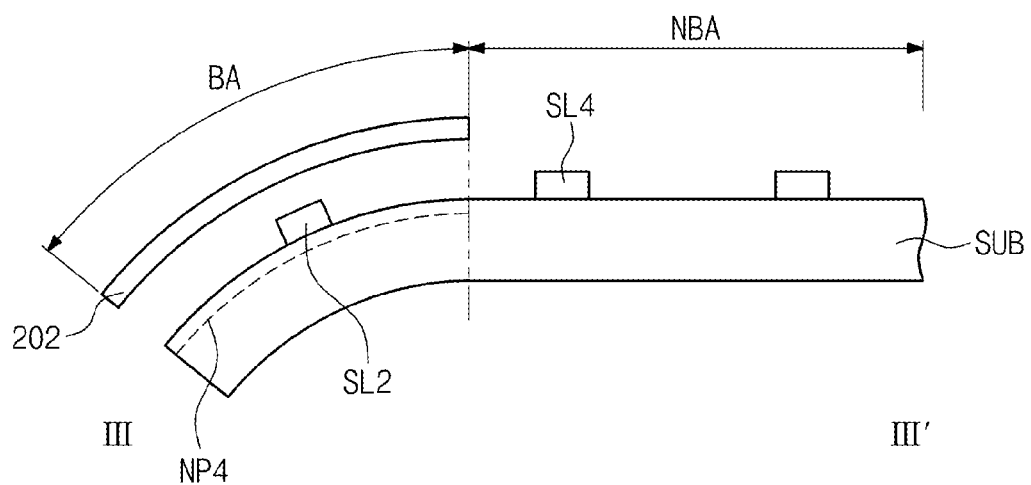
FIG. 10C is a cross-sectional view taken along a line III-III' shown in FIG. 10A.

FIG. 10A is a perspective view showing a display device according to an embodiment of the present disclosure, FIG. 10B is a cross-sectional view taken along a line II-II' shown in FIG. 10A, and FIG. 10C is a cross-sectional view taken along a line III-III' shown in FIG. 10A.

Referring to FIGS. 10A to 10C, a display device 10 includes an optical plate 200 overlapped with a display area DA and lines SL2 overlapped with a non-display area NDA. As described above, since a non-bending portion NBA is not bent, lines SL3 and SL4 disposed in the non-bending portion NBA are not influenced by vertical stress caused by the bending phenomenon, and thus the crack does not occur in the lines SL3 and SL4. Referring to FIG. 10B, among the lines SL1 and SL2 disposed in the bending portion BA, the lines SL1 disposed in the display area DA are disposed closer to a neutral plane NP3, and thus relatively small vertical stress is applied to the lines SL1. Accordingly, the crack does not occur in the lines SL1. Referring to FIG. 10C, since the lines SL2 disposed in the non-display area NDA are overlapped with the optical plate 200 and disposed closer to a neutral plane NP4 when compared to that shown in FIG. 9C, relatively small vertical stress is applied to the lines SL2, and as a result, the crack occurs in the lines SL2. Although not shown in FIG. 10C, the polarization pressure-sensitive adhesive layer 260 (refer to FIG. 5A) may be disposed between the lines SL2 and the second optical plate portion 202. The display device 10 according to the present embodiment prevents the crack from occurring, which is caused by the bending phenomenon, and thus the reliability of the display device 10 is improved.

Figure 11A:
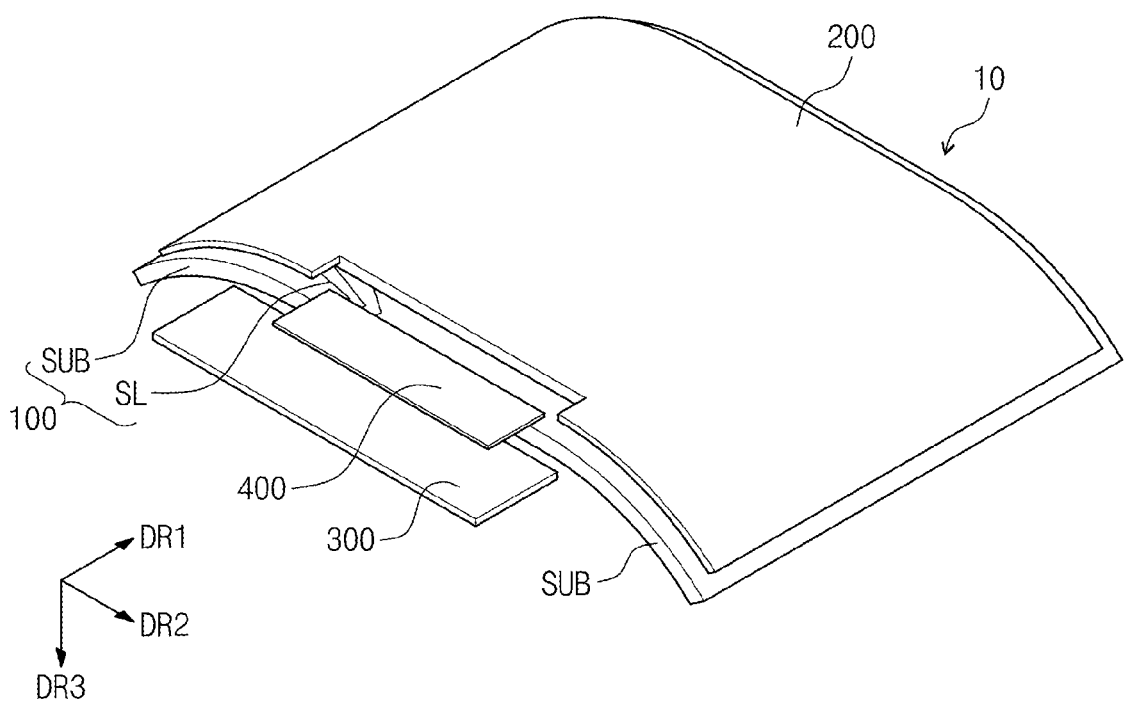
FIG. 11A is a perspective view showing a display device according to an embodiment of the present disclosure.
Figure 11B:
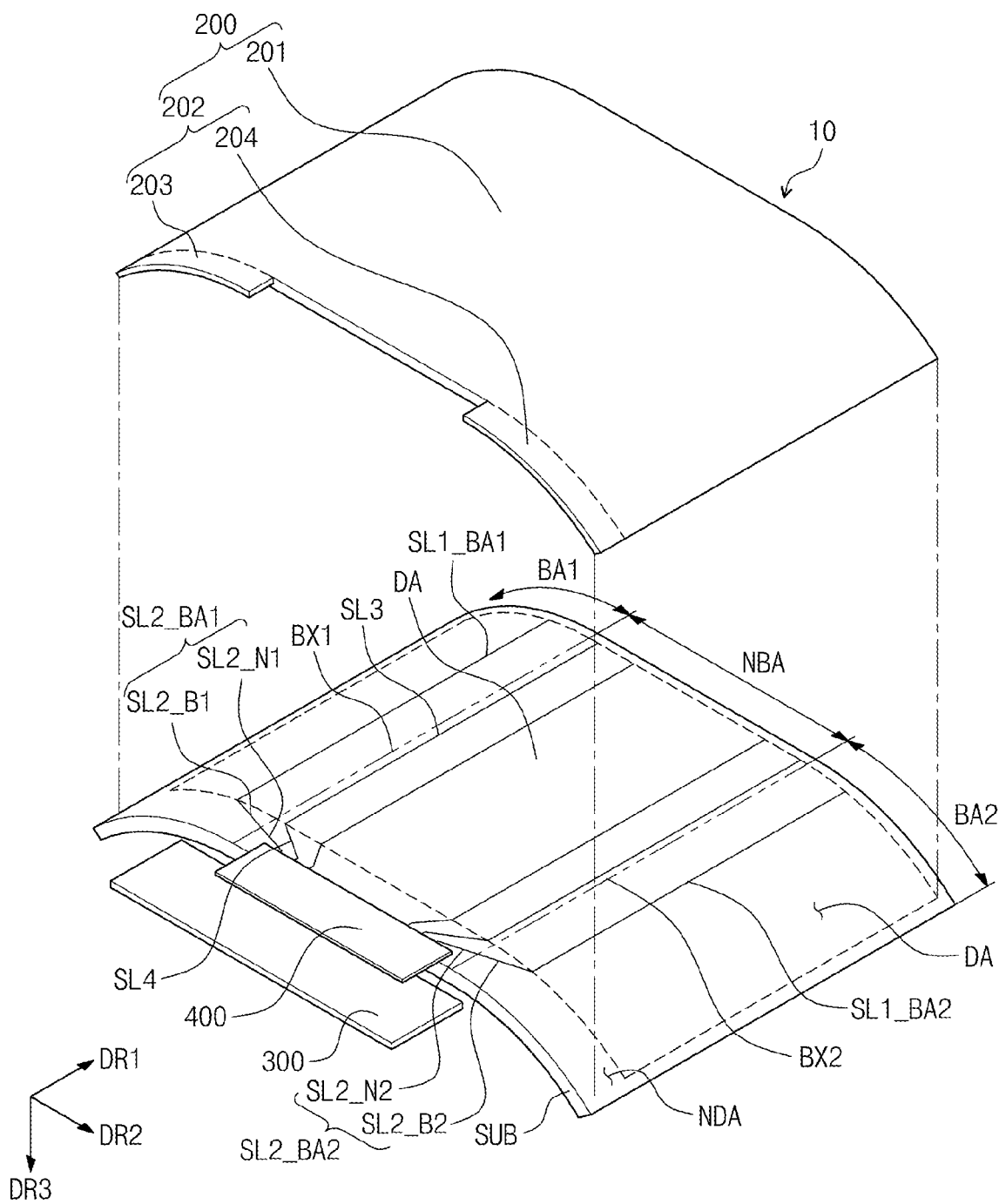
FIG. 11B is an exploded perspective view showing a display device according to an embodiment of the present disclosure.
Figure 11C:
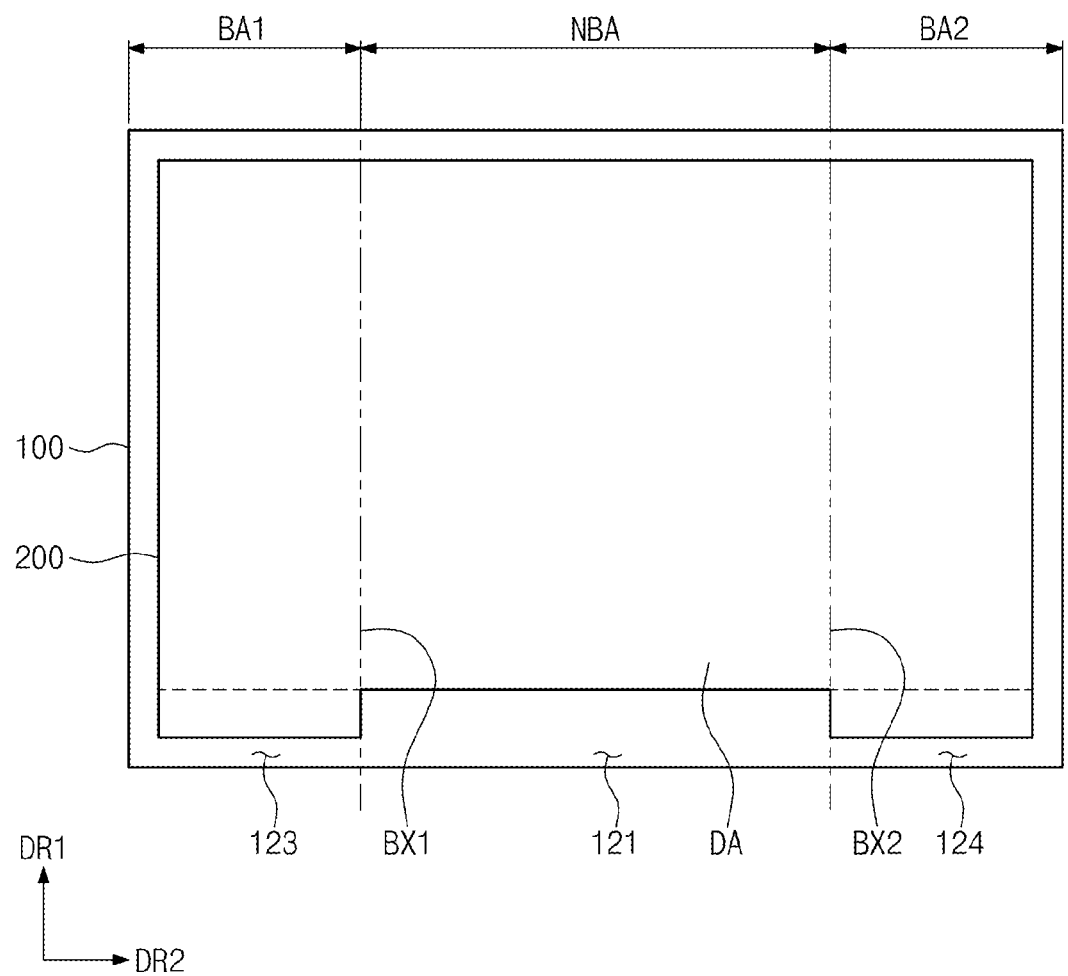
FIG. 11C is a plan view showing a display device according to an embodiment of the present disclosure.

FIG. 11A is a perspective view showing a display device according to an embodiment of the present disclosure, FIG. 11B is an exploded perspective view showing a display device according to an embodiment of the present disclosure, and FIG. 11C is a plan view showing a display device according to an embodiment of the present disclosure.

Referring to FIGS. 11A to 11C, the display panel 10 includes a first bending portion BA1 and a second bending portion BA2. In FIGS. 11A and 11B, the display panel includes two bending portions, but it should not be limited thereto or thereby. That is, the display panel 10 may include three or more bending portions.

The first bending portion BA1 includes a first non-display bending portion 123 in which the image is not displayed. The second bending portion BA2 includes a second non-display bending portion 124 in which the image is not displayed. The second bending portion BA2 is spaced apart from the first bending portion BA1 in a first direction DR1 crossing a second direction DR2. The optical plate 200 includes a second optical plate portion 203 and a third optical plate portion 204. The second optical plate portion 203 covers the first non-display bending portion 123 and the third optical plate portion 204 covers the second non-display bending portion 124.

In embodiments, the display panel includes a non-display non-bending portion 121, the first non-display bending portion 123 and the second non-display bending portion 124.

Lines SL include first lines SL1 (refer to FIG. 1A), second lines SL2 (refer to FIG. 1A), third lines SL3, and fourth lines SL4.

The first lines SL1 are configured to include first extensions SL1_BA1 disposed in the first non-display bending portion 123 and second extensions SL1_BA2 disposed in the second non-display bending portion 124.

The second lines SL2 are connected between the tape carrier package 400 connected to the printed circuit board 300 and the first lines SL1. The second lines SL2 are configured to include third extensions SL2_BA1 and fourth extensions SL2_BA2.

The third extensions SL2_BA1 are connected to between the tape carrier package 400 and the first extensions SL1_BA1. The fourth extensions SL2_BA2 are connected to between the tape carrier package 400 and the second extensions SL1_BA2. Each of the third extensions SL2_BA1 includes a first bending line portion SL2_B1 in the first non-display bending portion 123 and a first non-bending line portion SL2_N1 in the non-display non-bending portion 121. Each of the extension SL2_BA2 includes a second bending line portion SL2_B2 in the second non-display bending portion 124 and a second non-bending line portion SL2_N2 in the non-display non-bending portion 121.

The optical plate 200 includes the second optical plate portion 203 and the third optical plate portion 204. The second optical plate portion 203 is disposed over the first bending portion BA1 and covers the lines SL overlapped with the non-display area NDA. The second optical plate portion 203 covers the first non-display bending portion 123. The second optical plate portion 203 covers at least a portion of the third extensions SL2_BA1. The second optical plate portion 203 covers the first bending line portion SL2_B1. The second optical plate portion 203 further covers the first non-bending line portion SL2_N1.

The third optical plate portion 204 is disposed over the second bending portion BA2 and covers the lines SL overlapped with the non-display area NDA. The third optical plate portion 204 covers the second non-display bending portion 124. The third optical plate portion 204 covers at least a portion of the fourth extensions SL2_BA2. The third optical plate portion 204 covers the second bending line portion SL2_B2. The optical plate portion 204 further covers the second non-bending line portion SL2_N2.

When viewed in the thickness direction DR3 of the display panel 100, e.g., the third direction, the second optical plate portion 203 may have a polygonal shape, a circular shape, a semi-circular shape, or an oval shape, but it should not be limited thereto or thereby. The shape of the second optical plate portion 203 may be substantially the same as or different from that of the third optical plate portion 204 when viewed in the third direction DR3.

In the display device according to the present embodiments, the retardation film is disposed only in the first optical plate portion that covers the display area and not disposed in the second optical plate portion. Since the second optical plate portion covers the non-display area, the display light is not mixed with the external light, and as described later, the crack caused by bending the display panel may be reduced even though the retardation film is not disposed in the second optical plate portion. In addition, since the retardation film is disposed only in the first optical plate portion and not disposed in the second optical plate portion in the display device, the manufacturing cost of the display device may be reduced.

The display device includes the optical plate configured to include the first optical plate portion covering the display area and a second optical plate portion covering the lines overlapped with the non-display area. As described above, among the lines disposed in the bending portion, the lines disposed to overlap the non-display area are overlapped with the second optical plate portion and disposed closer to the neutral plane when compared to that when the lines are not overlapped with the second optical plate portion. Accordingly, the relatively small vertical stress is applied to the lines disposed in the non-display area, and thus the crack occurring by the bending phenomenon may be reduced. The display device may reduce or minimize the crack caused by the bending phenomenon and improve the reliability thereof.

Although the embodiments of the present invention have been described, it is understood that the present invention should not be limited to these embodiments but various changes and modifications can be made by one of ordinary skilled in the art within the spirit and scope of the present invention as hereinafter claimed.

What is claimed is:

1. A display device comprising:
   a display panel comprising a surface comprising a display area in which an image is displayed and a non-display area in which the image is not displayed, the display panel further comprising a bending portion that is bent with reference to a bend line which extends in a first direction and a non-bending portion that is not bent and that is adjacent to the bending portion in a second direction crossing the first direction, the display panel comprising:
   a base substrate,
   an array of pixels formed over the base substrate, and
   electrically conductive lines disposed over the base substrate and electrically connecting the array of pixels to an exterior device, the electrically conductive lines comprising at least one extension formed in the bending portion and overlapping the non-display area when viewed in a thickness direction of the display panel, the thickness direction crossing the first and second directions; and
   an optical plate to polarize light and disposed over the display panel,
   wherein the optical plate further comprises:
   a first optical plate portion covering the display area; and
   a second optical plate portion covering a part of the non-display area and covering at least a portion of the at least one extension of the electrically conductive lines, and
   wherein the second optical plate portion protrudes from the first optical plate portion in the first direction, and is shorter in length in the second direction than the first optical plate portion.

2. The display device of claim 1, wherein the optical plate further comprises a retardation film overlapping the array of pixels, and the retardation film does not extend to the second optical plate portion.

3. The display device of claim 1, wherein the first optical plate portion has a thickness greater than that of the second optical plate portion.

4. The display device of claim 1, wherein the first and second optical plate portions are at least partly bent with reference to the bend line together with the bending portion.

5. The display device of claim 1, further comprising:
   a printed circuit board electrically connected to the display panel; and
   a tape carrier package connecting the display panel and the printed circuit board, wherein the electrically conductive lines comprise:
   first lines disposed in the bending portion and overlapping the display area;
   second lines overlapping the non-display area and connecting between the first lines and the tape carrier package;
   third lines disposed in the non-bending portion and overlapping the display area; and
   fourth lines overlapping the non-display area and connecting between the third lines and the tape carrier package, the first optical plate portion covers the first lines and the third lines, and the second optical plate portion covers the at least one extension of the second lines.

6. The display device of claim 5, wherein the display area has a substantially rectangular shape, and the non-display area surrounds the display area when viewed in the thickness direction.

7. The display device of claim 5, wherein each of the second lines comprises:
   a bending line portion disposed in the bending portion and comprising the at least one extension; and
   a non-bending line portion disposed in the non-bending portion, and
   wherein the second optical plate portion covers the bending line portion, wherein the second optical plate portion further covers at least a portion of the non-bending line portion.

8. The display device of claim 1, wherein the optical plate further comprises:
   a retardation film overlapping the array of pixels;
   a lower protective film disposed over the retardation film;
   a polarizer disposed over the lower protective film; and
   an upper protective film disposed over the polarizer, wherein the polarizer comprises a first polarizer portion disposed in the first optical plate portion and a second polarizer portion disposed in the second optical plate portion.

9. The display device of claim 8, wherein the retardation film does not include a portion disposed between the second polarizer portion and the display panel.

10. The display device of claim 8, wherein each of the upper protective film and the lower protective film comprises a first portion disposed in the first optical plate portion and a second portion disposed in the second optical plate portion.

11. The display device of claim 8, wherein the lower protective film does not include a portion disposed between the second polarizer portion and the display panel, and the upper protective film comprises a first portion disposed in the first optical plate portion and a second portion disposed in the second optical plate portion.

12. The display device of claim 1, further comprising a polarization adhesive layer disposed between the display panel and the optical plate, wherein the polarization adhesive layer comprises:
a first polarization adhesive layer portion overlapping the first optical plate portion; and
a second polarization adhesive layer portion overlapping the second optical plate portion, and the second polarization adhesive layer portion has a thickness equal to or greater than that of the first polarization adhesive layer portion.

13. The display device of claim 1, wherein the first optical plate portion has a substantially rectangular shape and the second optical plate portion is connected to an end portion of a side of the first optical plate portion.

14. The display device of claim 1, wherein the second optical plate portion has a polygonal shape, a circular shape, a semi-circular shape, or an oval shape.

15. The display device of claim 1, wherein the display panel comprises a second bending portion, wherein the non-bending portion is disposed between the bending portion and the second bending portion when viewed in the thickness direction, wherein the electrically conductive lines comprises a second extension formed in the second bending portion and overlapping the non-display area when viewed in the thickness direction of the display panel, wherein the optical plate further comprises a third optical plate portion covering the second extension of the electrically conductive lines, and wherein the third optical plate portion extends from the first optical plate portion in the first direction, and is shorter in length in the second direction than the first optical plate portion.

16. The display device of claim 1, wherein the base substrate has a top surface and a bottom surface opposing each other, the bottom surface being farther from the second optical plate portion than the top surface, and wherein the at least one extension is disposed between the base substrate and the second optical plate portion such that a neutral plane of the bending portion is closer to the top surface of the base substrate than the bottom surface of the base substrate.

17. The display device of claim 1, wherein the optical plate further comprises:
a polarizer overlapping the bending portion and the non-bending portion in the thickness direction of the display panel;
a lower protective film formed between the polarizer and the base substrate; and
an upper protective film disposed over the polarizer, wherein the lower and upper protective films overlap the bending portion in the thickness direction of the display panel.

18. The display device of claim 17, wherein the polarizer is placed directly above the bending portion.

19. The display device of claim 17, wherein the polarizer is curved.

20. A display device comprising:
a display panel comprising a surface comprising a display area in which an image is displayed and a non-display area in which the image is not displayed; and
an optical plate to polarize light and disposed over the display panel and comprising a retardation film overlapping the display area and not overlapping the non-display area,
wherein the display panel comprises a non-display bending portion that is bent with reference to a bend line which extends in a first direction and a non-display non-bending portion that is not bent and that is adjacent to the non-display bending portion in a second direction crossing the first direction,
wherein the non-display bending portion and the non-display non-bending portion overlap the non-display area, wherein the optical plate comprises a first portion covering the display area and a second portion covering the non-display bending portion, and
wherein the second portion protrudes from the first portion in the first direction, and is shorter in length in the second direction than the first portion.

21. The display device of claim 20, wherein the second portion of the optical plate further covers a portion of the non-display non-bending portion.

22. The display device of claim 20, wherein the first portion of the optical plate has a thickness greater than that of the second portion of the optical plate.

23. The display device of claim 22, wherein the non-display area comprises a second non-display bending portion, wherein the non-display non-bending portion is disposed between the non-display bending portion and the second non-display bending portion when viewed in a thickness direction of the display panel, wherein the optical plate comprises a third portion covering the second non-display bending portion, and wherein the third portion extends from the first portion of the optical plate in the first direction, and is shorter in length in the second direction than the first portion.

* * * * *